(12) United States Patent
Matsuda

(10) Patent No.: US 10,779,394 B2
(45) Date of Patent: Sep. 15, 2020

(54) METHOD OF MANUFACTURING PRINTED CIRCUIT BOARD

(71) Applicant: NIPPON MEKTRON, LTD., Tokyo (JP)

(72) Inventor: Fumihiko Matsuda, Tokyo (JP)

(73) Assignee: NIPPON MEKTRON, LTD., Tokyo (JP)

(*) Notice: Subject to any disclaimer, the term of this patent is extended or adjusted under 35 U.S.C. 154(b) by 159 days.

(21) Appl. No.: 16/047,584

(22) Filed: Jul. 27, 2018

(65) Prior Publication Data

US 2019/0029108 A1 Jan. 24, 2019

Related U.S. Application Data

(62) Division of application No. 14/441,106, filed as application No. PCT/JP2014/054081 on Feb. 20, 2014, now abandoned.

(30) Foreign Application Priority Data

Apr. 25, 2013 (JP) ................................ 2013-092022

(51) Int. Cl.
*H01K 3/10* (2006.01)
*H05K 1/02* (2006.01)
(Continued)

(52) U.S. Cl.
CPC ............. *H05K 1/0216* (2013.01); *H01P 3/08* (2013.01); *H01P 3/082* (2013.01); *H01P 3/084* (2013.01);
(Continued)

(58) Field of Classification Search
CPC ....... H05K 1/0393; H05K 2201/09618; H05K 1/0237; H05K 9/0039; H05K 1/025;
(Continued)

(56) References Cited

U.S. PATENT DOCUMENTS 5,712,607 A 1/1998 Dittmer et al.
6,621,384 B1 * 9/2003 Handforth ............... H01P 3/087
174/117 AS
(Continued)

FOREIGN PATENT DOCUMENTS

CN 101312615 A 11/2008
JP 10-107514 A 4/1998
(Continued)

OTHER PUBLICATIONS

International Search Report dated Apr. 8, 2014, issued in corresponding application No. PCT/JP2014/054081.
(Continued)

*Primary Examiner* — Thiem D Phan
(74) *Attorney, Agent, or Firm* — Westerman, Hattori, Daniels & Adrian, LLP

(57) ABSTRACT

The invention provides a method of manufacturing a printed circuit board. The printed circuit board (100) has a conductor layer (ground layer (70)), a signal layer (25) having a signal line (20) provided so as to oppose the conductor layer (ground layer (70)), and an insulating resin layer (60) disposed between the conductor layer (ground layer (70)) and the signal layer (25), the insulating resin layer (60) has voids in an overlapping location, in a plan view, with the signal line (20), and the voids (40) are communicated with the outside of the printed circuit board (100).

4 Claims, 18 Drawing Sheets

(51) Int. Cl.
*H05K 1/03* (2006.01)
*H01P 3/08* (2006.01)
*H01P 11/00* (2006.01)
*H05K 3/00* (2006.01)

(52) U.S. Cl.
CPC ............ *H01P 11/003* (2013.01); *H05K 1/024* (2013.01); *H05K 1/028* (2013.01); *H05K 1/036* (2013.01); *H05K 3/0014* (2013.01); *H05K 3/0044* (2013.01); *H05K 3/0052* (2013.01); *H05K 2201/0355* (2013.01); *H05K 2201/09063* (2013.01); *H05K 2203/107* (2013.01); *Y10T 29/49165* (2015.01)

(58) Field of Classification Search
CPC ..... H05K 2201/05; H01P 3/08; H01P 11/003; H01P 3/082; H01P 5/107; H03H 7/38; Y10T 29/49165
USPC ......... 29/852, 601, 825, 829, 830, 832, 840, 29/847
See application file for complete search history.

(56) References Cited

U.S. PATENT DOCUMENTS

| | | | |
|---|---|---|---|
| 6,888,427 | B2 | 5/2005 | Sinsheimer et al. |
| 7,975,378 | B1 | 7/2011 | Dutta et al. |
| 9,335,344 | B2 * | 5/2016 | Ishii ................ G01R 1/067 |
| 2003/0214802 | A1 | 11/2003 | Fjelstad et al. |
| 2004/0036550 | A1 | 2/2004 | Emrick et al. |
| 2008/0023804 | A1 | 1/2008 | Dutta et al. |
| 2010/0090780 | A1 | 4/2010 | Song et al. |
| 2010/0148885 | A1 | 6/2010 | Tzuang et al. |
| 2014/0028413 | A1 | 1/2014 | Ishii et al. |
| 2015/0048906 | A1 | 2/2015 | Kato et al. |

FOREIGN PATENT DOCUMENTS

| | | |
|---|---|---|
| JP | 2001-345606 A | 12/2001 |
| JP | 2003-201362 A | 7/2003 |
| JP | 2003-318611 A | 11/2003 |
| JP | 2005-303778 A | 10/2005 |
| JP | 2007-027172 A | 2/2007 |
| JP | 2009-302606 A | 12/2009 |
| JP | 2010-098738 A | 4/2010 |
| JP | 2011-097283 A | 5/2011 |
| JP | 2012-009485 A | 1/2012 |
| JP | 2012-094639 A | 5/2012 |
| JP | 2012-119786 A | 6/2012 |

OTHER PUBLICATIONS

International Preliminary Report on Patentability dated Feb. 18, 2015, issued in corresponding application No. PCT/JP2014/054081.
Office Action dated Jun. 12, 2017, issued in Chinese Patent Application No. 20140002750.0.
Non-Final Office Action dated Jul. 13, 2016, issued in U.S. Appl. No. 14/441,106.
Final Office Action dated Jun. 7, 2017, issued in U.S. Appl. No. 14/441,106.
Non-Final Office Action dated Nov. 7, 2017, issued in U.S. Appl. No. 14/441,106.
Final Office Action dated May 8, 2018, issued in U.S. Appl. No. 14/441,106.

* cited by examiner

METHOD OF MANUFACTURING PRINTED CIRCUIT BOARD

CROSS-REFERENCE TO RELATED APPLICATION

This application is a divisional application of U.S. application Ser. No. 14/441,106, filed May 6, 2015, which is a national stage application of a PCT International Application No. PCT/JP2014/054081 filed on Feb. 20, 2014, which claims a priority of Japanese Patent Application No. 2013-092022 filed on Apr. 25, 2013.

TECHNICAL FIELD

The present invention relates to a printed circuit board and a method of manufacturing a printed circuit board.

BACKGROUND ART

In recent years, there has been increasing trends in higher processing speed of digital circuits, and increasing needs for high-density packaging. Signal lines on printed circuit boards used for these circuits are matched in impedance so as to adjust the characteristic impedance Z0 to a constant value, in order to prevent transmission loss and degradation of communication quality. The characteristic impedance Z0 is defined by a square root of (L/C) as given by the equation (1) below:

(Mathematical Formula 1)

$$Z0=\sqrt{(L/C)} \qquad (1)$$

where, Z0 is characteristic impedance, L is inductance, and C is capacitance.

The characteristic impedance Z0 is determined by physical shapes such as the width of signal line, the thickness of signal line, or the distance between the signal line and a ground layer, or physical characteristic values such as the dielectric constant of an insulating resin layer composing the printed circuit board, and the conductivity of the conductor layer.

For example, as for matching of the characteristic impedance Z0 of single-ended line, the characteristic impedance is generally controlled to 50Ω.

By the way, in recent years, there has been a need for increase in signal speed of the printed circuit board. To cope with the need, physical shape of an arbitrary configuration in the printed circuit board is controlled. This successfully satisfies the need to some degree. Typically, the characteristic impedance Z0 can be matched by increasing the width of the signal line and by increasing the thickness of the insulating resin layer, so as to reduce the capacitance.

On the contrary, there has also been a need for downsizing of devices. Therefore, despite the need for matching the characteristic impedance Z0 so as to reduce the transmission loss under high-speed signal transmission, the insulating resin layer has been increased in the thickness only to a limited degree.

For example, smartphone capable of handling high-speed signals equivalent to those in personal computer has widely disseminated. This sort of smartphone suffers from a trade-off between portability and provision of a sufficient battery capacity. The smartphone is therefore required to reduce the occupancy by components other than the battery in the instrument. Accordingly, the thickness of flexible printed circuit board with transmission lines has been becoming more stringently restricted than before.

Patent Literature 1 discloses a porous polyimide film with copper foil, composed of a copper foil and a porous polyimide film (see [FIG. 1] of this literature). The porous polyimide film contains micro-bubbles with a void diameter of approximately 0.2 μm, and has a porosity adjusted to 50% or around (see paragraphs [0060] to [0063] of this literature). Patent Literature 1 describes that the polyimide film may be reduced in the dielectric constant, by introducing isolated pores to make the film porous.

Patent Literature 2 discloses a strip transmission line substrate which includes a copper foil having thereon a strip conductor, and an aluminum ground substrate opposed to the copper foil while placing an air layer in between (see [FIG. 10] of this literature). The strip conductor is composed of an electrolytic copper plated layer and an electroless nickel plated layer, and has on the surface thereof an electroless gold plated layer. According to the description in paragraph [0024] of this literature, the air layer has a small dielectric loss, and is therefore effective as a dielectric layer opposed to the strip conductor. This paragraph of this literature also describes that the ground substrate provided while placing the air layer in between contributes to reduce radiation loss, and synergistically with an effect of using the air layer as a dielectric layer, also contributes to improve the transmission characteristic.

CITATION LIST

Patent Literature

[Patent Literature 1] JP-A-2003-201362
[Patent Literature 2] JP-A-2003-318611

SUMMARY OF THE INVENTION

Technical Problem

The present inventors focused on that, by reducing the dielectric constant of the insulating layer by introducing thereinto the air as described in Patent Literatures 1 and 2, the capacitance may be decreased without increasing the thickness of the insulating layer, and thereby the transmission loss may be reduced. The present inventors then discussed use of the porous polyimide film described in Patent Literature 1, or the air layer, that is the dielectric layer described in Patent Literature 2, as the insulating layer of the printed circuit board. It was finally found that the porous polyimide film disclosed in Patent Literature 1, and the printed circuit board having the air layer as the dielectric layer disclosed in Patent Literature 2, have suffered from serious problems in the productivity or reliability of the printed circuit board.

More specifically, the porous polyimide film disclosed in Patent Literature 1 contains a large number of fine voids each of which forming a closed space. The air in the fine voids expands in the heating processes such as reflow process during mounting on the printed circuit board or during post processes, or under changes in pressure during transportation, or under changes in ambient temperature during use. Such expansion is much likely to induce deformation or breakage of the film.

Also the air layer described in Patent Literature 2 forms a closed space. Accordingly, the air confined in the air layer are again causative of problems same as those of the air confined in the isolated fine voids.

The present invention was conceived in view of the problems above. That is, the present invention is to provide a printed circuit board capable of reducing the transmission loss under high-speed signal transmission without relying upon thickening of the insulating resin layer, and is excellent in productivity and reliability, and a method of manufacturing such printed circuit board.

Solution to Problem

According to the present invention, there is provided a printed circuit board which includes a conductor layer, a signal layer having a signal line provided so as to oppose the conductor layer, and an insulating resin layer disposed between the conductor layer and the signal layer, the insulating resin layer having a void in an overlapping location, in a plan view, with the signal line, and the void being communicated with the outside of the printed circuit board.

According to the present invention, there is also provided a method of manufacturing a printed circuit board having a conductor layer, a signal layer having a signal line provided so as to oppose the conductor layer, and an insulating resin layer disposed between the conductor layer and the signal layer, the method includes: a void forming step forming a void in the plane of an insulating resin film; a substrate forming step forming a substrate by providing the signal line on one face of the insulating resin film obtained in the void forming step, in an overlapping location, in a plan view, with the void, and by providing the conductor layer on the other side, to thereby form a substrate which includes the insulating resin layer having the insulating resin film provided with the void, and the signal line and the conductor layer which are opposed to each other while placing the insulating resin layer in between; and an opening forming step forming an opening through which communication between the void, provided in the substrate obtained by the substrate forming step, and the gas phase outside the substrate is established.

Advantageous Effects of Invention

The printed circuit board of the present invention includes the insulating resin layer having a void. The void provided to the insulating resin layer communicates with the outside of the printed circuit board. Accordingly, gas or the like enclosed in the void can flow outward, if it expands in the heating processes such as reflow process during manufacturing of the circuit board, or under changes in pressure during transportation, or under changes in ambient temperature during use. In these cases, the printed circuit board of the present invention is therefore prevented from being deformed or broken.

The printed circuit board of the present invention is excellent in the productivity and reliability, from the viewpoint of that it includes the insulating resin layer having the void. The printed circuit board of the present invention includes the insulating resin layer having the void. The printed circuit board of the present invention can, therefore, reduce the dielectric constant of the insulating resin layer, without relying upon thickening of the insulating resin layer. In addition, the printed circuit board of the present invention can reduce the transmission loss under high-speed signal transmission.

The method of manufacturing a printed circuit board of the present invention can stably manufacture a printed circuit board which includes a conductor layer, an insulating resin layer, and a signal layer, the insulating resin layer having a void, and the void being communicated with a gas phase outside of the printed circuit board.

BRIEF DESCRIPTION OF DRAWINGS

The above and other objects, advantages and features of the present invention will be more apparent from the following description of certain preferred embodiments taken in conjunction with the accompanying drawings.

FIG. 14B is a plan view illustrating a second insulating layer in the third embodiment of the present invention.

FIG. 15A, FIG. 15B and FIG. 15C FIG. 15A, FIG. 15B and FIG. 15C are drawings explaining a void forming step of the method of manufacturing a printed circuit board according to the fourth embodiment of the present invention, wherein FIG. 15A is a plan view illustrating an insulating resin layer formed in the void forming step, FIG. 15B is an A-A' cross sectional view of FIG. 15A, and FIG. 15C is a B-B' cross sectional view of FIG. 15A.

FIG. 16A, FIG. 16B and FIG. 16C FIG. 16A, FIG. 16B and FIG. 16C are drawings explaining a substrate forming step of the method of manufacturing a printed circuit board according to the fourth embodiment of the present invention, wherein FIG. 16A is a plan view illustrating a substrate formed in the substrate forming step, FIG. 16B is an A-A' cross sectional view of FIG. 16A, and FIG. 16C is a B-B' cross sectional view of FIG. 16A.

FIG. 17A, FIG. 17B and FIG. 17C FIG. 17A, FIG. 17B and FIG. 17C are drawings explaining an opening forming step of the method of manufacturing a printed circuit board according to the fourth embodiment of the present invention, wherein FIG. 17A is a plan view illustrating a printed circuit board manufactured in the opening forming step and a trimmed edge portions, FIG. 17B is an A-A' cross sectional view of FIG. 17A, and FIG. 17C is a B-B' cross sectional view of FIG. 17A.

DESCRIPTION OF EMBODIMENTS

Figure 1:
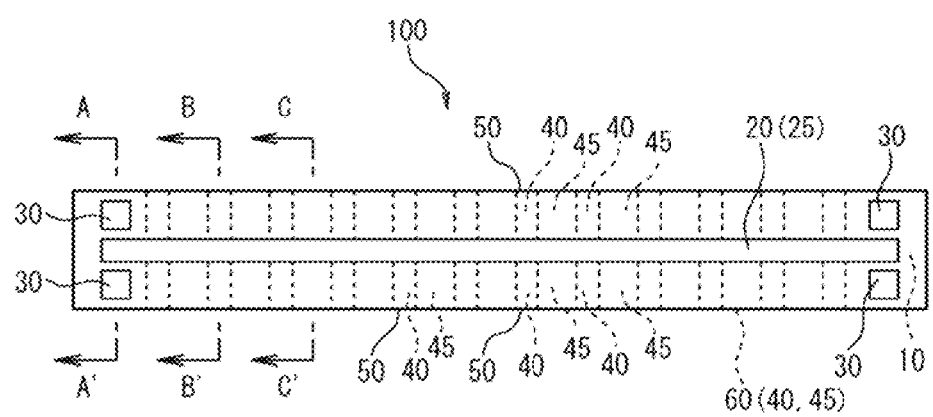
FIG. 1 A plan view illustrating a printed circuit board according to a first embodiment of the present invention.

First embodiment to fourth embodiment of the present invention will now be explained referring to the attached drawings. In all drawings, all similar constituents will be given the same reference signs to avoid repetitive explanation. The embodiments will occasionally be explained while defining the frontward, backward, leftward, rightward, upward and downward directions in the drawings. Note, however, that the definition is merely for the convenience sake to simplify explanation of relative relations among the constituents, and by no means limit the directionality according to which any product embodying the present invention is manufactured or used.

The various constituents of the present invention are not always necessarily be independent entities, instead allowing for example that one constituent forms a part of other constituent, and that a part of one constituent overlaps a part of other constituent.

The individual constituents described in one embodiment may arbitrarily be diverted to other embodiments, without departing from the spirit of the present invention.

The "sheet" and "film" described in this specification may be diverted, and are by no means specified in the respective thicknesses by such difference of naming.

The first embodiment illustrates a printed circuit board 100 with a microstrip line structure, as one embodiment of the printed circuit board of the present invention.

The second embodiment illustrates a printed circuit board 200 with a microstrip line structure, as another embodiment of the printed circuit board of the present invention. The second embodiment is different from the first embodiment in the location of openings 50.

The third embodiment illustrates a printed circuit board 300 with a microstrip line structure, as another embodiment of the printed circuit board of the present invention.

The fourth embodiment illustrates an exemplary method of manufacturing the printed circuit board 100, as one embodiment of the method of manufacturing according to the present invention.

First Embodiment

Figure 2:
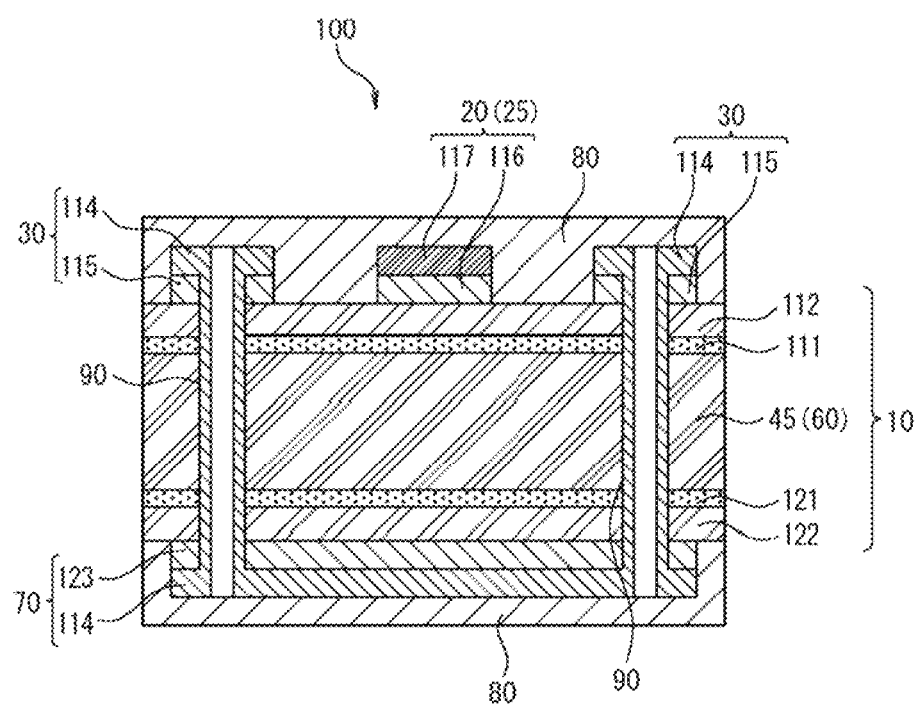
FIG. 2 An A-A' cross-sectional view of the printed circuit board illustrated in FIG. 1.
Figure 3:
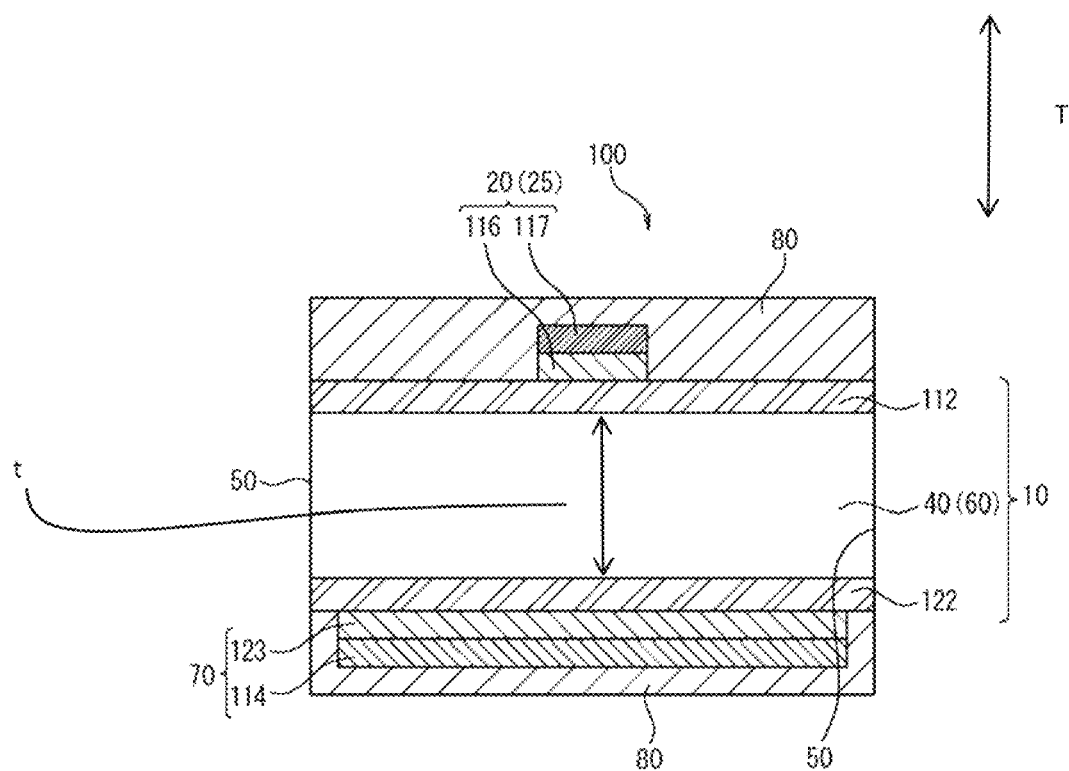
FIG. 3 A B-B' cross-sectional view of the printed circuit board illustrated in FIG. 1.
Figure 4:
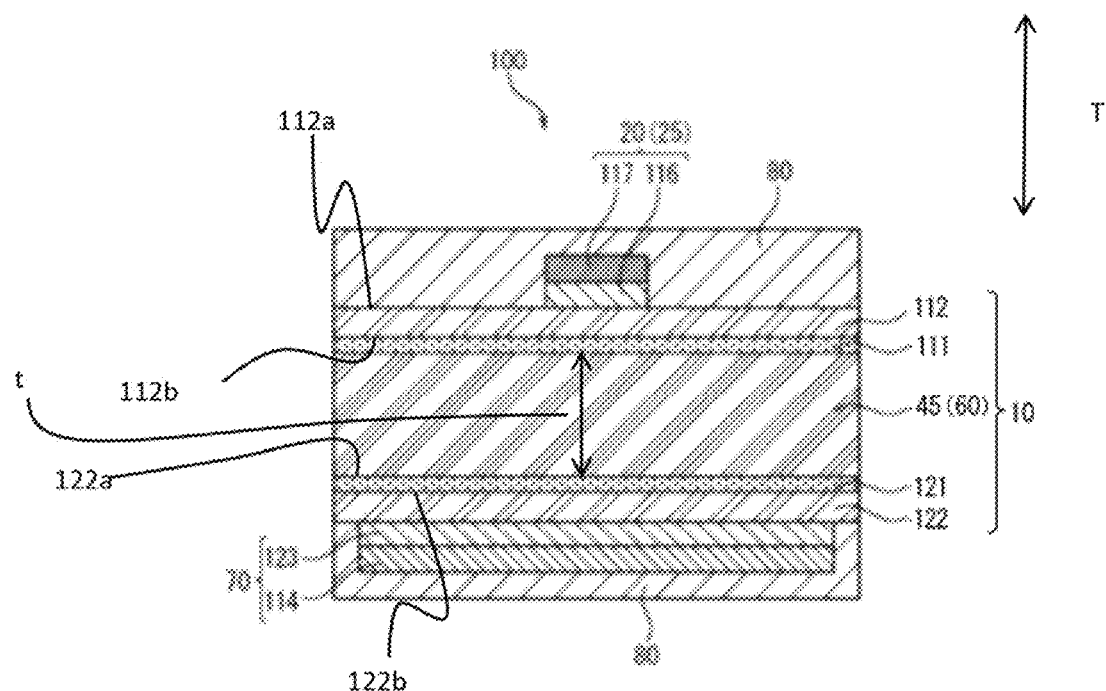
FIG. 4 A C-C' cross-sectional view of the printed circuit board illustrated in FIG. 1.
Figure 5A:
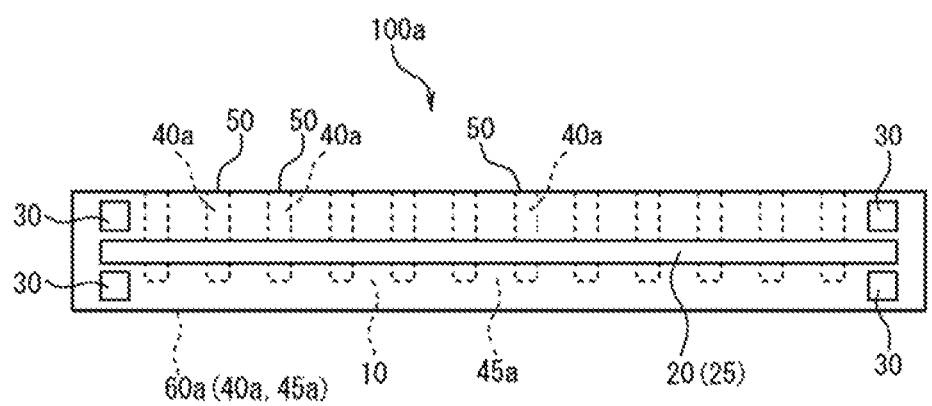
FIG. 5A and FIG. 5B FIG. 5A and FIG. 5B are plan views illustrating printed circuit boards as modified examples of the first embodiment of the present invention.
Figure 5B:
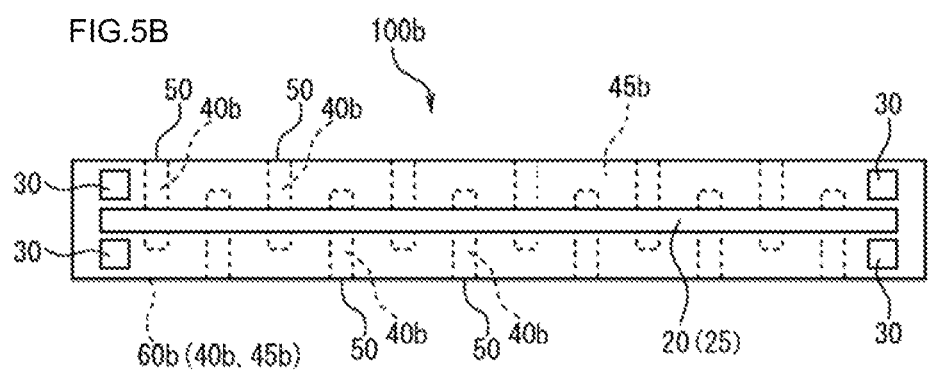

The first embodiment of the present invention will be explained referring to FIG. 1 to FIG. 4, FIG. 5A, and FIG. 5B. FIG. 1 is a plan view illustrating the printed circuit board 100 according to the first embodiment, and shows that an insulating resin layer 60 which configures an insulating layer 10 has voids 40 and insulating resin parts 45. FIG. 2 is an A-A' cross sectional view of the printed circuit board 100 illustrated in FIG. 1. FIG. 3 is a B-B' cross sectional view of the printed circuit board 100 illustrated in FIG. 1. FIG. 4 is a C-C' cross sectional view of the printed circuit board 100 illustrated in FIG. 1. FIG. 5A and FIG. 5B are plan views of printed circuit boards 100a, 100b as modified examples of the first embodiment of the present invention.

As illustrated in FIG. 2, the printed circuit board 100 has a ground layer 70 as a conductor layer, a signal layer 25 having a signal line 20 provided so as to oppose the ground layer 70, and an insulating resin layer 60 disposed between the ground layer 70 and the signal layer 25.

As illustrated in FIG. 1, the insulating resin layer 60 has voids 40 at overlapping positions, in a plan view, with the signal line 20. The voids 40 are communicated with the outside of the printed circuit board 100. In the present invention or in the description of the present invention, the "plan view" is a view taken at right angles to the principal plane of the printed circuit board, unless otherwise noted. In the present invention or in the description of the present invention, the "overlapping positions of the insulating resin layer, in a plan view, with the signal line" mean the positions where, in a plan view, the insulating resin layer and the signal line overlap in the thickness direction of the printed circuit board.

For example, the voids 40 may communicate with the outside of the printed circuit board 100, by possessing openings 50. The openings 50 are preferably provided at different positions from the signal line 20. In other words, the openings 50 are preferably formed so as to avoid a mode in which the voids 40 communicate with the outside while extending through the signal line 20. In this way, it is now possible to avoid disturbance of the state of transmission through the signal line 20, due to residence of the openings 50. In this embodiment, it is however allowable to provide the openings 50 through the signal line 20, by fully reducing the cross sectional area of the openings 50 when viewed in a cross section in the width direction of the signal line 20.

Although not illustrated, in one modified example of this embodiment, in place of providing the openings 50, any one of the top face, bottom face and side faces surrounding each void 40 may be configured by a gas-permeable component. This allows the voids 40 to communicate with the outside.

Typically as illustrated in FIG. 1, the voids 40 extend in the width direction of the signal line, and the openings 50 are provided on the outer rim along the long sides of the printed circuit board. This allows the voids 40 to communicate with the outside.

As illustrated in FIG. 1, in this embodiment, the openings 50 may be provided on a portion of the outer rim of the printed circuit board 100. This embodiment encompasses the case where the openings 50 are provided on the outer rim, along a portion other than the long sides, of the printed circuit board 100. The portion of the outer rim where the openings 50 are provided is determined by a portion where the voids 40 reach the outer rim.

The present invention encompasses an embodiment where the openings are provided in a portion other than the outer rim of the printed circuit board 100. Such embodiment will be explained later in second embodiment.

In this embodiment, the openings 50 are provided on the outer rim of the printed circuit board 100. Accordingly, even for the case where any other electronic parts are mounted on the top face or the back face of the printed circuit board 100, this embodiment will not excessively limit the available space for the mounting. When the printed circuit board 100 is manufactured, it is general to carry out "trimming" in the later stage of manufacturing processes, in order to cut off an unnecessary portion on the outer rim or around. By cutting together the end portions of the voids 40 in the process of trimming, the openings 50 may be formed on the outer rim of the printed circuit board 100. Thus, this embodiment is also advantageous in terms of manufacture, in that the openings 50 may be formed concurrently in the process of trimming.

According to this embodiment, the insulating resin layer 60 may be reduced in dielectric constant, by providing therein the voids 40. In more detail, the dielectric constant of a general insulating resin layer substantially composed of an insulating resin only, is determined by the dielectric constant, as a physical property, of such insulating resin. On the contrary, in this embodiment, by providing the voids 40 in the insulating resin layer 60, the dielectric constant of the insulating resin layer 60 may be reduced down below the dielectric constant which is determined by the physical property of the insulating resin composing the insulating resin part 45.

This embodiment enables reduction in the dielectric constant of the insulating resin layer 60. According to this embodiment, it is now possible to provide a highly-practical printed circuit board, capable of satisfying both requirements of high-speed signal transmission and downsizing of device, without relying upon thickening of the insulating resin layer 60.

This embodiment also enables signal transmission over a longer distance, as compared with a conventional printed circuit board having an insulating resin layer of the same thickness but having no void. This ensures a large degree of freedom for designing electronic instrument in a limited space.

When compared, under the same transmission distance, between this embodiment and the conventional printed circuit board having an insulating resin layer of the same thickness but has no void, this embodiment is capable of transmission up to higher frequency band, and is more suitable for high-speed transmission.

In addition, the voids 40 in this embodiment communicate with the outside, allowing them to have an opened structure. Accordingly, the voids 40 are prevented from expanding even under changes in the temperature environment and pressure, and thereby the printed circuit board may be prevented from being deformed or broken. Accordingly, this embodiment successfully provides the printed circuit board 100 having a practical level of good electric characteristics described above.

In this embodiment, the voids 40 are allowed to contain an arbitrary gas. Alternatively, depending on necessary specifications or modes of embodiment of the printed circuit board 100, the inside of the voids 40 may be configured by liquid or other atmosphere. The inside atmosphere of the voids 40 is preferably same as the outside of the printed circuit board 100. For an exemplary case where the voids 40 are filled with an arbitrary gas, also the outer atmosphere of the printed circuit board 100 is preferably configured by such arbitrary gas. For an exemplary case where the printed circuit board 100 is used substantially in vacuo, both of the inside of the voids 40 and the outside of the printed circuit board 100 are vacuum.

The dielectric constant of the gas contained in the voids 40 and the dielectric constant of the gas composing the external atmosphere of the printed circuit board 100 are preferably lower than the dielectric constant of the insulating resin part 45 which composes the insulating resin layer 60. The gas contained in the voids 40 and the gas composing the external atmosphere of the printed circuit board 100 may be different, but preferably same.

The configuration of the printed circuit board 100 will further be detailed referring to the drawings.

As illustrated in FIG. 1, the printed circuit board 100 is provided thereon with the signal line 20 which is covered with a protective layer 80 not illustrated in FIG. 1 (see FIG. 2). On the left and right at both ends of the signal line 20, arranged are ground pads 30. Inside of the printed circuit board 100, provided is an insulating resin layer 60.

The insulating resin layer 60 is configured by the voids 40 and insulating resin parts 45. The voids 40 and the insulating resin parts 45 are alternately and regularly arranged in the longitudinal direction of the printed circuit board 100. In one example, the insulating resin parts 45 in this embodiment may be formed as a substantially dense resin layer. The substantially dense resin layer conceptually excludes any resin layer having an internal void intentionally provided, and any porous resin. The description above does not conceptually exclude, in this embodiment, the insulating resin parts 45 configured by any resin layer having an internal void intentionally provided, and any porous resin.

Each void 40 in this embodiment forms substantially one spatial region between the insulating resin part 45 and the insulating resin part 45. The one spatial region means a through space between the insulating resin part 45 and the insulating resin part 45, substantially without partition or wall. Accordingly, each void 40 provided between the insulating resin part 45 and the insulating resin part 45 can keep the internal atmosphere uniform. When a gas is contained in such voids 40, every one void 40 between the insulating resin part 45 and the insulating resin part 45 can be prevented from causing nonuniformity of temperature or local difference of volume of the gas.

In a plan view, the voids 40 are formed so as to extend in the width direction of the signal line 20. In other words, the voids 40 cross the signal line 20. This embodiment is thus capable of ensuring overlapping of the signal line 20 with the voids 40 and the insulating resin parts 45. Accordingly, this embodiment can fully enjoy an effect of reducing the dielectric constant through provision of the voids 40, in order to solve the problems expected to be solved by the present invention.

Note, however, this embodiment is not limited to a single embodiment where the voids 40 completely extend through the signal line 20 in the width direction. This embodiment encompasses an embodiment where the end portions of the voids 40 reside, in a plan view, in the middle of the width of the signal line 20. Even with such embodiment, the effect of reducing the dielectric constant through provision of the voids 40 takes much part in controlling the capacitance between the signal line 20 and the ground layer 70, and contributes to solve the problems expected to be solved by the present invention.

FIG. 1 showed the embodiment where the voids 40 and the signal line 20 cross at right angles. This embodiment is, however, not limited to the embodiment above, allowing the angle of intersection to be determined arbitrarily.

In the printed circuit board 100 of this embodiment, in a plan view, the signal line 20 and the linear (or rectangular) voids 40 cross at right angles. Although not illustrated, shape of the voids 40 is not limited to such linear shape. This embodiment may be provided with the voids 40 having a shape, in a plan view, other than linear shape, which overlap the signal line 20 at an arbitrary portion. The voids 40 having a shape other than the linear shape include those having a regular shape such as circle, oval or triangle; and irregularly-shaped voids 40.

In this embodiment, as illustrated in FIG. 1, a plurality of voids 40 are repeatedly formed at regular intervals. The voids in this embodiment have a regular shape and are arranged unidirectionally. All of the plurality of voids 40 illustrated in FIG. 1 are patterned in one way. Although not illustrated, in this embodiment, the plurality of voids 40 may be patterned in two or more ways and may be arranged as mixed. As illustrated in FIG. 1, in a plan view, the plurality of voids 40 extend across the signal line 20, in a direction intersecting the direction of extension of the signal line 20. All of the plurality of voids 40 cross the signal line 20 at nearly equal angles. The plurality of voids 40 cross, in a plan view, the linear signal line 20 at right angles. Note that the plurality of voids 40 may be all voids 40 provided on the printed circuit board 100, or may be a majority of the plurality of void 40. This embodiment encompasses the case where a majority of the plurality of voids 40 provided on the printed circuit board 100, excluding some exceptional voids 40, are arranged in a plan view regularly with respect to the signal line 20.

As illustrated in FIG. 1, the printed circuit board 100 of this embodiment is configured so that, in a plan view, the signal line 20 and the plurality of voids 40 or plurality of portions of the voids 40 cross regularly. In this way, the effect of the insulating resin layer 60 having the voids 40, to be exerted on the printed circuit board 100, may be expressed uniformly over the plane of the printed circuit board 100.

As can be understood from FIG. 1 and FIG. 3, the printed circuit board 100 has the voids 40 which extend through the insulating resin layer 60 in the thickness direction. In this way, the insulating resin layer 60 is zoned in the in-plane direction into the insulating resin parts 45 containing the insulating resin, and the voids 40.

In particular, the printed circuit board 100 of this embodiment have two or more voids 40 not communicating with each other, and the opening 50 is provided to every void 40.

According to this embodiment, the insulating resin parts 45 which isolate the voids 40 extend through the insulating resin layer 60 in the thickness direction. By means of the insulating resin layer 60, the printed circuit board is ensured with high rigidity in the thickness direction. The printed circuit board 100 may occasionally be bent when incorporated into devices, or may be loaded by external force in the thickness direction in the process of manufacture. Even in such cases, by virtue of provision of the insulating resin layer 60, the printed circuit board 100 may be prevented from being crushed, or the voids 40 are prevented from being modified in thickness.

The thickness of the insulating resin layer 60 may be kept constant by the insulating resin parts 45. In other words, the insulating resin parts 45 also serve as spacers in the insulating resin layer 60 in the thickness direction thereof.

Although not illustrated, other embodiments of the printed circuit board of the present invention encompass the case where a part of, or all of the voids in the insulating resin layer have irregular shapes, and communicate with each other to form uninterrupted voids. In this case, the openings are not necessarily provided regularly at predetermined positions. In this case, it suffices that an end portion of the mutually communicated voids, which reaches the outer side face of the printed circuit board, serves as the opening. For example, even if the voids are configured by the uninterrupted voids locally in the insulating resin layer, the insulating resin parts 45 which extend over the insulating resin layer in the thickness direction are provided at arbitrary portions. In this way, the insulating resin layer may be ensured with rigidity in the thickness direction. For an exemplary case where a through-hole is provided to the printed circuit board, insulating resin parts 45 which extend over the insulating resin layer in the thickness direction are provided around the through-hole which extends through the insulating resin layer. It is also possible to provide the uninterrupted voids at arbitrary positions of the insulating resin layer, other than the portions described above.

In the printed circuit board 100 of this embodiment, an insulating base 112 having the signal line 20, and the insulating resin layer 60 are bonded by an adhesion layer 111. On the other hand, on the opposite surface of the insulating resin layer 60, an insulating base 122 having a copper foil layer 123 is bonded by an adhesion layer 121.

The copper foil layer 123 and a plated layer 114 provided on the surface thereof configure the ground layer 70. In other words, the printed circuit board 100 adopts a so-called microstrip line structure, characterized by the signal line 20 opposed to the ground layer 70 while placing the insulating resin layer 60 in between. The insulating base 112 has a first surface 112a and a second surface 112b. The insulating base 122 has a third surface 122a and a fourth surface 122b.

As illustrated in FIG. 1, the signal layer 25 of the printed circuit board 100 is provided with ground pads 30. The signal line 20 is configured by stacking, on the top face of the insulating base 112, a copper foil layer 116 and a plated layer 117 in this order. Also the ground pads 30 are similarly configured by stacking, on the top face of the insulating base 112, a copper foil layer 115 and a plated layer 114 in this order. The signal line 20 and the ground pads 30 may be formed independently. Alternatively, the signal line 20 and the ground pads 30 may be formed at the same time in the same process, by patterning the copper foil formed over the insulating base 112 according to a predetermined pattern. The ground pads 30 are conductive parts having a wider width than the signal line 20, and are electrically connected via through-holes 90 to the ground layer 70 provided on the surface opposite to the signal layer 25.

The copper layer composing the ground layer 70 and the signal line 20 is one example of conductive materials, and any other conductive materials other than the copper foil may properly be selected and used for the ground layer 70 and the signal line 20.

As illustrated in FIG. 2, the printed circuit board 100 has the through-holes 90.

The through-holes 90 extend through the insulating resin parts 45, and through which the ground pads 30 and the ground layer 70 are electrically connected by allowing their plated layers 114 to communicate with each other.

At around the through-holes 90 which extend through the insulating resin layer 60, the insulating resin parts 45 are provided. By such residence of the insulating resin parts 45, not the voids 40, at and around the locations where the through-holes 90 are formed, the through-holes 90 are formed more easily and advantageously. Moreover, with this embodiment, the periphery of the thus formed through-holes 90 is prevented from being mechanically weakened. Although not illustrated, the through-holes in this embodiment are not always necessarily be provided at the end portions, in the longitudinal direction, of the printed circuit board 10, but also may be provided at arbitrary positions so as to extend through the insulating resin layer 60. Around any of, or all of the through-holes provided at arbitrary positions, the insulating resin parts 45 are preferably provided.

In the layer structure of the printed circuit board 100, as illustrated in FIG. 2 to FIG. 4, protective layers 80 are provided at the topmost layer and the lowermost layer in the drawing, by which the printed circuit board 100 is physically protected. The protective layers 80 are generally formed using an insulating material such as insulating resin. In the description of the layer structure of the printed circuit board 100, the up-down directionality follows the up-down directionality of the cross sectional views shown in FIG. 2 to FIG. 4.

Under the topmost protective layer 80, provided is the signal layer 25 having the signal line 20. As described above, the number and shape of the signal lines 20 composing the signal layer 25 are arbitrary. The signal line 20 has a copper foil layer 116 as the lower layer, and a plated layer 117 stacked thereon. The width of the signal line is generally designed so as to satisfy the characteristic impedance Z0 specified for the individual printed circuit boards. While the width of the signal line adoptable in this embodiment is not specifically limited, it is selectable in a wide range, for example, from 50 µm or larger and 900 µm or smaller. Design of this embodiment allows a relatively large line width such as 200 µm or larger and 900 µm or smaller, and more narrowly 400 µm or larger and 800 µm or smaller. Such advantageous electrical characteristics are attributable to that the printed circuit board 100 of this embodiment has the voids 40 in the insulating resin layer 60, and that the voids 40 are communicated with the outside of the printed circuit board 100. In short, this embodiment can embody, in the insulating resin layer 60, the dielectric constant which is smaller than the dielectric constant intrinsic to the physical property of the material composing the insulating resin layer 60. The voids 40 are communicated with the outside of the printed circuit board 100. Accordingly, this embodiment can avoid deformation of the printed circuit board 100 due to expansion of the voids 40, under varied temperature environment or pressure during the manufacture, transportation, or use. This embodiment can therefore provide the practical printed circuit board 100 having good electrical characteristics and excellent in the productivity and reliability.

This embodiment provided with a plurality of signal lines includes an embodiment in which all lines are designed to have the same width, and an embodiment in which a part or all of the lines have different widths. In this embodiment, a single line may have a constant width, or may have different widths at arbitrary positions.

The copper foil layer 116 may be patterned by a technique such as printing or photolithography.

Copper foil used for the copper foil layer 116 is one example of conductive materials. As a substitute for the copper foil, any of conductive metal materials such as copper-containing composition and silver-containing composition; or any of metal foils such as silver foil and nickel foil may be used. As the metal foil, a single metal foil may be used, or a stack based on a proper combination may be used.

The plated layer 117 may be configured by using a material same as the conductive material composing the plated layer 114 which electrically connects the ground pads 30, through the through-holes 90, with the ground layer 70. Of course, the plated layer 117 and the plated layer 114 may be configured by different conductive materials. Material for configuring the plated layer 114 and/or plated layer 117 is exemplified by electrolytic copper plating, but not limited thereto. In this embodiment, as a substitute for the plating composing the plated layer 114 and/or the plated layer 117, a conductive paste may be used for interlayer connection.

This embodiment has an insulating base 112 under the signal layer 25. The insulating base 112 is stacked on the insulating resin layer 60 while placing the adhesion layer 111 in between. The insulating base 112 may be configured by glass-epoxy, Teflon (registered trademark) glass or alumina. In particular, by selecting a highly-flexible material for the insulating base 112, the printed circuit board 100 may be given flexibility. In this way, this embodiment may be configured as a so-called flexible printed circuit board. The highly-flexible material is exemplified by polyamide resins such as polyimide resin, polyamide resin, and polyamide-imide resin; thermosetting resins such as epoxy resin; and thermoplastic resins such as liquid crystal polymer. As the highly-flexible material, also an insulating fiber base such as glass woven fabric is selectable. In particular, from the viewpoint of reducing the transmission loss, polyimide resin or liquid crystal polymer is preferably selected as a dielectric having a small dielectric constant. More specifically, for example, an insulating film of 20 µm to 30 µm thick, mainly composed of a liquid crystal polymer may be used as the insulating base 112, and such insulating base 112 may be combined with the insulating resin layer 60. In this way, this embodiment can advantageously provide the printed circuit board 100 significantly reduced in transmission loss and showing flexibility.

The adhesion layer 111 is a layer which enables stacking of the insulating base 112 and the insulating resin layer 60, so that it is generally configured by an insulating adhesive. The adhesion layer 111 is typically configured by acrylic resin, epoxy-based resin, polyimide-based resin, liquid crystal polymer or glass-epoxy, but not limited thereto. The adhesion layer 111 may be formed by printing using any of these insulating materials, or by bonding a film, but not limited thereto. More specifically, for example, the adhesion layer 111 may be configured by a low-flow-type bonding sheet which uses, as the major ingredient of adhesive, any one of glass-epoxy, polyimide-based resin, and polyethylene terephthalate-based resin. The adhesion layer 111 may have a thickness of, for example, but not limited to, approximately 10 µm to 20 µm.

The insulating resin layer 60 is configured to have the voids 40 and the insulating resin parts 45 as described above. The voids 40 in the printed circuit board 100 extend, in a plan view, from one long side towards the other long side of the printed circuit board 100, and have the openings 50 at both ends in the direction of extension. Accordingly, when a cross section of the printed circuit board 100 is taken along the direction of extension, in a plan view, of the void 40, the void 40 is seen in the insulating resin layer 60 as illustrated in FIG. 3. Also the insulating resin parts 45, disposed between the adjacent voids 40 extend, in a plan view, from one long side towards the other long side of the printed circuit board 100. Accordingly, when a cross section of the printed circuit board 100 is taken along the direction of extension, in a plan view, of the insulating resin part 45, the void 40 is seen in the insulating resin layer 60 as illustrated in FIG. 4. The printed circuit board 100 is designed to have, on both end portions thereof, the insulating resin parts 45. On both end portions of the printed circuit board 100, there are provided the ground pads 30, and around which in a plan view the insulating resin parts 45 reside (see FIG. 2).

The insulating resin parts 45 may be configured by a material same as that configuring the insulating base 112 descried above. The insulating resin parts 45, and the insulating base 112 or the insulating base 122, may be configured by the same material, or may be configured by different materials. From the viewpoint of reduction in transmission loss, the insulating resin parts 45 are preferably configured by polyimide resin or liquid crystal polymer.

Under the insulating resin layer 60, the adhesion layer 121 and the insulating base 122 are further provided. The adhesion layer 121 may be configured in the same way as the adhesion layer 111. Both layers may be configured by the same material, or different materials. The insulating base 122 may be configured in the same way as the insulating base 112. Both layers may be configured by the same material, or different materials. The printed circuit board 100 has an insulating layer 10 which includes the insulating base 112, the adhesion layer 111, the insulating resin layer 60, the adhesion layer 121, and the insulating base 122. In this way, this embodiment may have additional insulating layers on the upper side and/or lower side of the insulating resin layer 60. This embodiment encompasses an embodiment having, substantially as the insulating layer 10, only the insulating resin layer 60 between the signal layer 25 and the ground layer 70.

In this embodiment, as illustrated as the insulating layer 10 in the printed circuit board 100, additional insulating layers may be stacked on the upper side and lower side of the insulating resin layer 60. In this case, the insulating layer 10 may have a layer structure which is symmetrical in the thickness direction about insulating resin layer 60 at the center. For example, in the printed circuit board 100, such symmetrical layer structure may be achieved by assigning the same thickness to the adhesion layer 111 and the adhesion layer 121, and by assigning the same thickness to the insulating base 112 and the insulating base 122. In this embodiment, it is particularly preferable to reduce as possible the thickness of the insulating base 112 and the insulating base 122, since the air layer may have a large thickness as a consequence. From this point of view, the insulating base 112 and the insulating base 122 preferably have, for example, a thickness of 70 µm or larger and 130 µm or smaller, and more preferably 90 µm or larger and 110 µm or smaller. In this embodiment, the adhesion layer 111 and the adhesion layer 121, and the insulating base 112 and the insulating base 122 are respectively configured by the same materials, so as to make the structure symmetrical also in terms of physical property.

Now the distance from the void 40 to the signal line 20 will be referred to as "distance I", and the distance from the void 40 to the ground layer 70 will be referred to as "distance II".

If distance I and distance II are nearly equal, the capacitance between the signal line 20 and the ground layer 70 may be reduced as compared with the case where distance I and distance II are different.

Although not illustrated, if the distance I is smaller than distance II, effective dielectric constant may further be reduced, as compared with the case where distance I and distance II are nearly equal, or the case where distance II is larger than distance I. Distance I may be made smaller than distance II, typically by omitting the insulating base 112 from the printed circuit board 100, or by making the thickness of the insulating base 112 smaller than that of the insulating base 122.

The insulating layer 10 illustrated in FIG. 3 has the void 40, the insulating base 112, and the insulating base 122, but has no adhesion layer 111 and no adhesion layer 121 illustrated in FIG. 2. In this way, this embodiment may be configured to have no insulating adhesion layer between the void 40 and any other layer stacked so as to adjoin thereto. For example, to the insulating resin layer 60 before the voids 40 are formed therein (that is, the insulating resin layer 60 composed of the insulating resin part 45), the adhesion layer 111 and the adhesion layer 121 are tentatively bonded in advance, to thereby prepare an insulating resin film with adhesion layers. The voids 40 may be formed by punching the insulating resin film with adhesion layers at arbitrary positions in the thickness direction, using dies having a predetermined shape. In this embodiment, the insulating adhesion layers may be removed from the upper and lower sides of the voids 40 which extend through the insulating resin layer 60 in the thickness direction, so as to allow the voids 40 to directly adjoin to other layer without placing the adhesion layers in between. In this way, this embodiment can further reduce the dielectric constant of the insulating resin layer 60, or of the insulating layer 10 containing the insulating resin layer 60, to thereby contribute to reduce the transmission loss. As shown in FIGS. 3 and 4, flexible printed circuit board having a thickness direction T, and the insulating resin layer 60 having an overall thickness t.

Alternatively, although not illustrated, this embodiment encompasses an embodiment where the adhesion layer 111 and the adhesion layer 121 are provided on the upper and lower sides of the voids 40. For example, the adhesion layer 111 is tentatively bonded to the insulating base 112 in advance, and the adhesion layer 121 is tentatively bonded to the insulating base 122, to thereby prepare an insulating resin film composed of the insulating resin part 45. Next, the voids 40 are formed by punching the insulating resin film at arbitrary positions in the thickness direction, using dies having a predetermined shape. The insulating resin layer 60 is formed in this way. Thereafter, the adhesion layer 111 and the adhesion layer 121 are bonded respectively on the upper face and the lower face of the insulating resin layer 60 having the voids 40 formed therein, to thereby form the insulating layer 10. In this way, is is now possible to materialize this embodiment having the adhesion layer 111 and the adhesion layer 121 also on the upper and lower faces of the voids 40.

The ground layer 70 provided under the insulating layer 10 is one mode of the conductor layer in this embodiment. The conductor layer in the present invention is a layer configured by a conductive material, and encompasses layers allowed for electric conduction, which include so-called ground layer, sealing layer and electrode layer.

The conductor layer in this embodiment, including the ground layer 70, may be configured using any of conductive metal materials such as copper-containing composition and silver-containing composition; or using any of metal foils such as copper foil, silver foil and nickel foil, and may be patterned by printing, photolithography or the like. As the metal foil, a single metal foil may be used, or a stack based on a proper combination may be used.

In the insulating resin layer 60, the volume ratio of the voids 40 to the insulating resin parts 45 is not specifically limited. It is however effective, from the viewpoint of reducing the transmission loss, to increase the volume ratio of the voids 40 taking the rigidity of the printed circuit board 100 into account.

For example, in this embodiment, as illustrated in FIG. 1, the plurality of voids 40 which extend through the width direction of the printed circuit board 100, and the plurality of insulating resin parts 45 which extend over the width direction, may be regularly arranged in the direction of extension of the printed circuit board 100.

For an exemplary case where the voids 40 and the insulating resin parts 45 have the same length of extension in the width direction of the printed circuit board 100, the dimension of the voids 40 in the direction of extension of the printed circuit board 100 preferably falls in the range of 0.1 mm or larger and 10 mm or smaller. In this way, the effect of reducing the dielectric constant of the insulating resin layer 60, through the provision of the voids 40, may be expressed to a significant degree. By setting the dimension of the insulating resin parts 45 in the direction of extension of the printed circuit board 100 in the range of 1 mm or larger and 10 mm or smaller, this embodiment is now capable of ensuring the rigidity of the printed circuit board 100 endurable to practical use. More preferably, the dimension of the voids 40 is set in the range described above, and the dimension of the insulating resin parts 45 is concurrently set in the range described above.

In particular, in the dimensional ranges described above, the voids 40 are preferably configured to have a dimension equal to or larger than that of the insulating resin parts 45.

In this way, the rigidity of the printed circuit board and the effect of reducing the dielectric constant of the insulating resin layer 60 may be balanced successfully.

From the viewpoint of more effectively reducing the transmission loss under high-speed transmission in this embodiment, in a plan view, the width of the signal line 20 which overlaps the voids 40 and the width of the signal line 20 which overlaps the insulating resin parts 45 may be different. In particular, in a plan view, the width of the signal line 20 is preferably larger in the region overlapping the voids 40 than in the region overlapping the insulating resin parts 45. This is because, between the signal line 20 and the ground layer 70, the portions having the voids 40 provided therein tends to have an effective dielectric constant smaller than that in the portions having the insulating resin parts 45 provided therein. By such tuning of the width of the signal line 20, this embodiment can satisfy the requirement for precise impedance matching, and can more effectively reduce the transmission loss under high-speed transmission.

The printed circuit board 100 specifically illustrated in the drawing shows a mode provided with the signal layer 25 having a single signal line 20. This embodiment may however have two or more signal lines 20. The signal line 20 is not always necessarily be linear, and may have any of general patterns of the signal line formable on the printed circuit board, such as having a kink at an arbitrary position, and such as widened or narrowed at an arbitrary position.

This embodiment when provided with a plurality of signal lines 20 encompasses a case where, in a plan view, a single void 40 extends over the width of all signal lines 20; separate voids 40 extend over the width of every single, or every arbitrary number of signal lines 20; and combinations of them.

For example, in this embodiment, the signal layer 25 may have a plurality of signal lines 20 arranged in parallel to each other. In this case, in a plan view, the voids 40 may be provided corresponding to all of the plurality of signal lines 20 arranged in parallel, so as to extend over the width thereof. In this case, this embodiment encompasses a mode where an independent single void 40 overlaps with all of the plurality of signal lines 20 so as to extend over the width thereof; and a mode where a plurality of independent voids 40 overlap with an arbitrary number of signal line(s) out of the plurality of signal lines 20 so as to extend over the width thereof.

According to these modes, this embodiment enables a high-speed transmission design in all of the plurality of signal lines 20.

This embodiment may, however, include a mode with a plurality of signal lines 20, where the void(s) 40 are provided, in a plan view, corresponding to any one of, or two or more of the signal lines 20 so as to extend over the width thereof, and are not provided corresponding to other signal lines 20 so as to extend over the width thereof.

As a modified example of this embodiment although not illustrated, in the mode which includes the signal layer 25 having a plurality of signal lines 20, the signal layer 25 may have a first signal line and a second signal line different in path length. In this mode, a possible configuration is that the first signal line has a path length longer than that of the second signal line, and that the first signal line crosses the void 40 over a length longer than the length over which the second signal line crosses the void 40.

The speed of electric signal tends to be faster in the overlapping region, in a plan view, of the void 40 and the signal line 20, than in the overlapping region of the insulating resin part 45 and the signal line 20. Accordingly, by controlling the length of crossing as described above, time lag between the first signal line having a long path length and the second signal line having a short path length becomes controllable.

The path length of signal line described above means the distance between one end portion and the other end portion, in the direction of extension, of the signal line. The length of crossing of the signal line 20 and the void 40 means a length of the overlapping region, when viewed in the direction of extension of the signal line 20, over which the void 40 which extends over the width of the signal line 20 overlaps the signal line 20. For the case where each of the first signal line and the second signal line has a plurality of overlapping regions, the lengths of crossing of the individual overlapping regions are summed up for each signal line, to find the total length of crossing for comparison.

The printed circuit board 100 according to the first embodiment adopts a microstrip line structure. This embodiment, however encompasses a layer structure where the signal layer and the conductor layer are opposed while placing the insulating resin layer in between, and encompasses both of combined structure of these single layers and multi-layered stacked structure. Accordingly, a built-up, multi-layered printed circuit board may contain two or more signal layers, and at least one of which may be the signal layer 25. The present invention encompasses a mode where, in such multi-layered printed circuit board, the ground layer 70 and the insulating resin layer 60 are provided corresponding to such one signal layer 25. The individual configurations and the elements shown in this embodiment are properly adoptable to s printed circuit board having a strip line structure.

A printed circuit board 100a, having voids 40a with a shape different from that of the voids 40 in the printed circuit board 100, is shown in a plan view of FIG. 5A, and a printed circuit board 100b, having voids 40b with another different shape is shown in a plan view of FIG. 5B.

The voids 40a and the voids 40b have a linear shape which extends in the width direction of the printed circuit board 100, and are regularly arranged at regular intervals in the direction of extension of the printed circuit board 100. In this point of view, the void 40a and the void 40b have the same pattern of formation as the voids 40. Although cross sectional views corresponding to FIG. 5A and FIG. 5B are not shown, both of the void 40a and the void 40b extend through the insulating resin layer 60 over the full range of thickness.

Each void 40a is arranged so that one end portion of its linear body reaches the outer rim of one long side of the printed circuit board 100a, and so that the opening 50 resides at the end portion. While the void 40a extends, in a plan view, across the signal line 20 in the width direction, the other end portion of the voids 40a does not reach the outer rim of the other long side of the printed circuit board 100a and remains closed. According to such pattern of formation of the void 40a, in the insulating resin layer 60, an uninterrupted insulating resin part 45a may be provided along the outer rim of the other long side of the printed circuit board 100a, in the direction of extension thereof.

Another exemplary mode is configured by arranging, in a plan view, the voids 40b symmetrically about the signal line 20 at the center. More specifically, the voids 40b are configured by alternately disposing those patterned to reach the outer rim of one long side of the printed circuit board 100b so as to form the opening 50 there, and those patterned to reach the outer rim of the other long side of the printed circuit board 100b so as to form the opening 50 there. The voids 40b patterned in either way have the closed end portions on the opposite side of the openings 50, and extend across the signal line 20 in a plan view. According to this configuration, the insulating resin part 45b having a meandering, but uninterrupted, pattern is provided in the direction of extension of the printed circuit board 100b.

Both of the voids 40a and voids 40b described above are successful to ensure a sufficient area of overlapping, in a plan view, of the signal line 20 and the voids 40a, and to reduce the transmission loss. In addition, both of the voids 40a and voids 40b are successful to ensure a sufficient level of rigidity of the printed circuit board 100a.

Patterns of formation of voids shown in this embodiment and other embodiment encompass both cases where the formation takes place over the entire surface of the printed circuit board, and where the formation takes place in an arbitrary area. In other words, this embodiment encompasses a case where the signal line provided on the printed circuit board has a shape other than linear shape. This embodiment also encompasses a case where there are two or more signal lines which are different in shape. Accordingly, in this embodiment, the voids suitable for the design of signal line may be formed selectively in an arbitrary region.

The layered structure shown in the printed circuit board 100 of this embodiment may occasionally have an arbitrary additional layer between one layer and the adjoining other layer, without departing from the spirit of the present invention. Also layered structures in other embodiments described later may occasionally have an arbitrary other layer, in the same way as described above.

Second Embodiment

Figure 6:
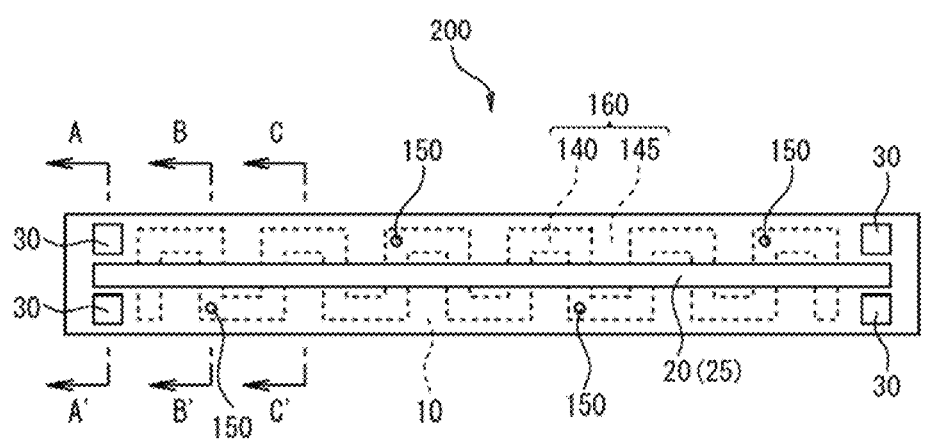
FIG. 6 A plan view illustrating a printed circuit board according to a second embodiment of the present invention.
Figure 7:
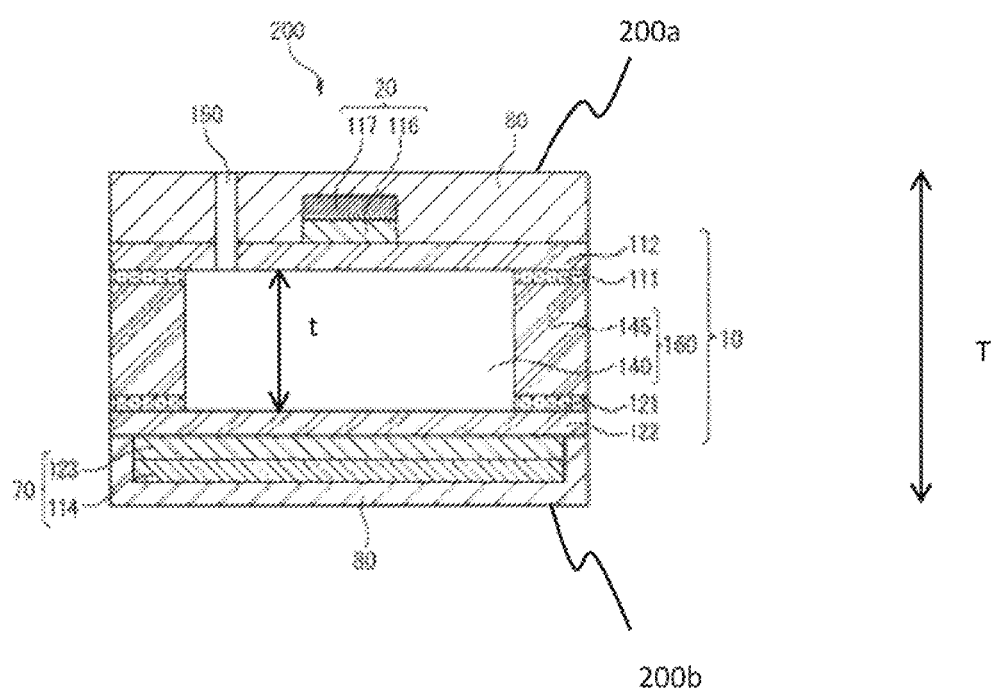
FIG. 7 A B-B' cross-sectional view of the printed circuit board illustrated in FIG. 6.
Figure 8:
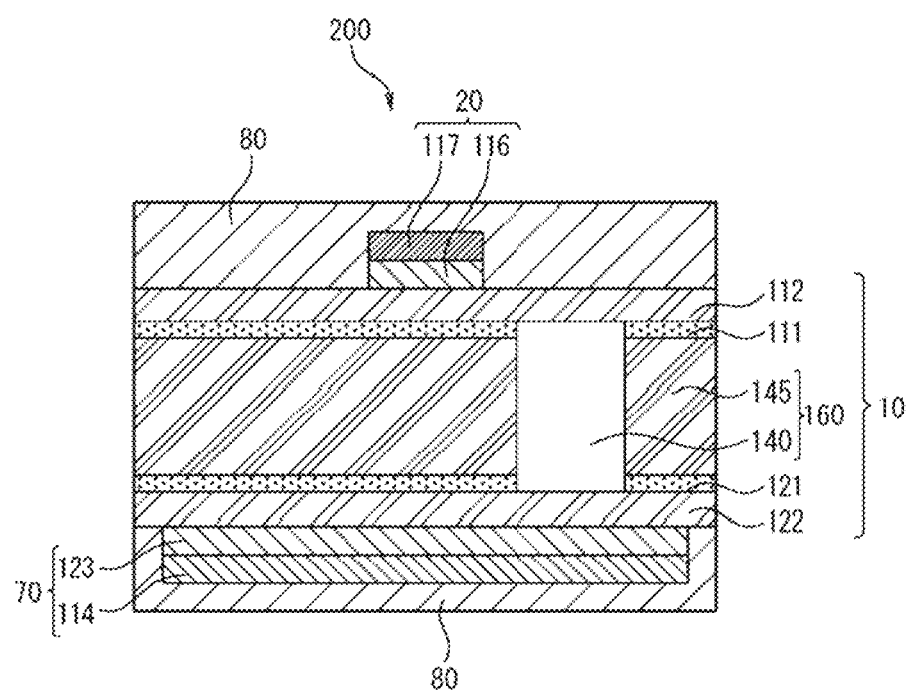
FIG. 8 A C-C' cross-sectional view of the printed circuit board illustrated in FIG. 6.
Figure 9:
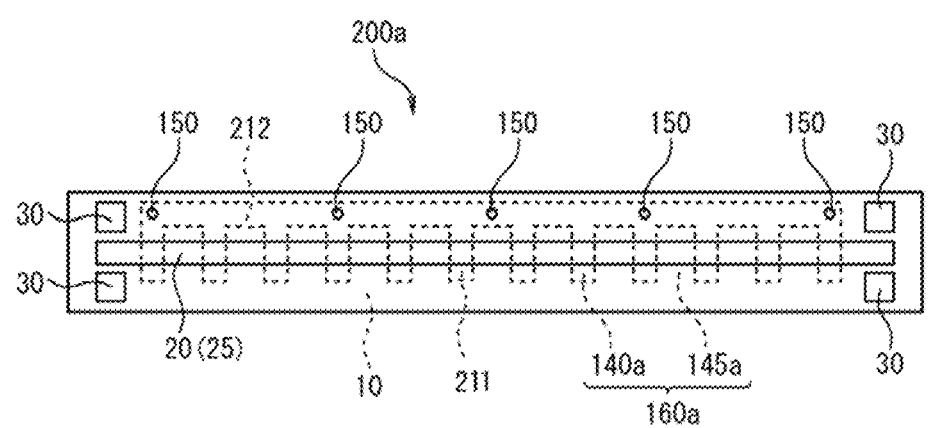
FIG. 9 A plan view illustrating a printed circuit board as a modified example of the second embodiment of the present invention.

Next, a second embodiment of the present invention will be explained referring to FIG. 6 to FIG. 9. FIG. 6 is a plan view of a printed circuit board 200 of the second embodiment. FIG. 7 is a B-B' cross sectional view of the printed circuit board 200 illustrated in FIG. 6. FIG. 8 is a C-C' cross sectional view of the printed circuit board 200 illustrated in FIG. 6. FIG. 9 is a plan view of a printed circuit board 200a according to a modified example of the second embodiment.

The printed circuit board 200 of this embodiment is configured in the same way as the printed circuit board 100, except that the configuration of an insulating resin layer 160 is different from the configuration of the insulating resin layer 60 in the printed circuit board 100. More specifically, the pattern of formation of a void 140 and location of formation of openings 150 in the insulating resin layer 160 are different from those of the voids 40 and the openings 50 composing the insulating resin layer 60.

As illustrated in FIG. 6, the void 140 in the printed circuit board 200 crosses the signal line 20 in the width direction of the signal line 20, but does not reach the outer rim of the long sides of the printed circuit board 200. In other words, the printed circuit board 200 have no opening on the outer rim of the long sides of the printed circuit board 200.

The openings 150 in the printed circuit board 200 are provided to the top face of the printed circuit board 200. The top face of the printed circuit board 200 means the face on the side having the signal layer 25 which is opposed to the ground layer 70 as a conductive layer, while placing the insulating resin layer 60 in between. The flexible printed circuit board extends from a top face 200a to a back face 200b in a thickness direction T, as shown in FIG. 7

Although not illustrated, as a modified example of this embodiment, the openings 150 may be provided to the back face of the printed circuit board 200. The back face of the printed circuit board 200 means the face on the side having the ground layer 70 which is opposed to the signal layer 25, while placing the insulating resin layer 60 in between.

The openings 150 are holes through which the void 140 is allowed to communicate with the outside of the printed circuit board 200, and are provided at positions, in a plan view, not overlapping with the signal line 20. As illustrated in FIG. 7, the openings 150 in the form of holes extend from the void 140 buried in the printed circuit board 200 to the top face side of the printed circuit board 200. In other words, the openings 150 extend through the layers laid over the void 140 (the insulating base 112 and the protective layer 80, in FIG. 7).

When the openings 150 are provided to the top face side of the printed circuit board 200, the location of the openings 150 may be determined arbitrarily, so as not to overlap with the location where the signal line 20 is formed. The area and shape of the openings 50 in the first embodiment were restricted by the cross section of the voids 40 taken in the thickness direction. In contrast, the area and shape of the openings 150 are restricted by the shape of the void 140 in a plan view. For this reason, this embodiment enjoys a larger degree of freedom in designing the openings 150.

Since the openings 150 are provided to the top face of the back face of the printed circuit board 200, such provision of the openings 150 will cause substantially no or very small influence on the rigidity in the thickness direction of the printed circuit board 200.

Next, the shape of the void 140 will be explained.

As illustrated in FIG. 6, the void 140 has a repetitive pattern, in a plan view, configured by portions which cross the signal line 20 in the width direction, and portions which extend along the long sides of the printed circuit board 200. As described above, the void 140 has no portion which reach the outer rim of the printed circuit board 200.

The void 140 illustrated in FIG. 6 forms a through-space in the insulating resin layer 160, which extends over the direction of extension of the printed circuit board 200, while repeating kinking and straight-running. In the insulating resin layer 160, the insulating resin part 145 resides around the void 140. The void 140 does not reach the outer rim of the long sides of the printed circuit board 200. Accordingly, in this embodiment, the insulating resin part 145 has uninterrupted regions along the outer rim. As a consequence, this embodiment successfully ensures a good level of rigidity of the printed circuit board 200.

The void 140 has, in a plan view, a shape symmetrical about the signal line 20 at the center, and is formed in a so-called meandering pattern in which kinking is repeated on both sides of the signal line 20.

The void 140 in the printed circuit board 200 is formed to give a through-space. To such void, provision of at least one opening 150 will suffice. FIG. 6 illustrates an exemplary mode where the openings 150 are provided at four arbitrary points at the corners where the void 140 kinks. Although not illustrated, in a modified example of this embodiment, the void 140 may be disconnected at arbitrary position (s) in the direction of kinking and straight-running, so as to be divided into two or more spaces. When two or more voids 140 divided from each other are provided in the insulating resin layer 160, at least one opening 150 is formed in each void 140.

A cross section taken along line A-A' in FIG. 6 is taken in a location where the ground pads 30 and unillustrated through-holes 90 are provided at around the end portion of the signal line 20. The A-A' cross section implied by FIG. 6 is same as the A-A' cross section illustrated in FIG. 2, and therefore will not be illustrated and explained again.

A cross section taken along line B-B' in FIG. 6 is taken just at the upwardly-opened opening 150 which originates from the void 140, as illustrated in FIG. 7. The opening 150 originates from the void 140 and goes through upward so as not to overlap the location of the signal line 20. The void 140 resides in a location which includes a portion just below the signal line 20.

A cross section taken along line C-C' in FIG. 6 is taken in a location where the void 140 is not laid just under the signal line 20, as illustrated in FIG. 8. As is understood from FIG. 7 and FIG. 8, when the printed circuit board 200 is observed in a cross section taken nearly normal to the direction of extension of the signal line 20 while directing the ground layer 70 downward, the insulating resin parts 145 reside on both lateral sides of the void 140.

The printed circuit board 200 can show a cross section in which the void 140 has a larger area than the insulating resin part 145 (FIG. 7), and a cross section in which the insulating resin part 145 has a larger area than the void 140 (FIG. 8).

As illustrated in FIG. 6, in this embodiment, the void 140 and the insulating resin part 145 composing the insulating resin layer 160 are arranged in a well-balanced manner over the plane of the printed circuit board 200. Accordingly, this embodiment successfully ensures a good level of rigidity of the printed circuit board 200. The printed circuit board 200 which is ensured a good configuration as described above can avoid defects, such that it may crush in the thickness direction under external force in the process of manufacture, to cause variation in the thickness of the air layer. In addition, the printed circuit board 200 will be durable enough when assembled as folded into devices.

A printed circuit board 200a according to a modified example of this embodiment is illustrated in FIG. 9. The printed circuit board 200a is configured in the same way as the printed circuit board 200, except that it has an insulating resin layer 160a having a void 140a which is asymmetrical, in a plan view, about the signal line 20, and an insulating resin part 145a provided therearound.

The void 140a has intersection parts 211 which cross, in a plan view, the signal line 20 over the entire width thereof, and an extension part 212 which extends along the outer rim of the long edge on one side of the printed circuit board 200a. An overall shape of the void 140a is a single comb. Provision of at least one opening 150 for such single void 140a will suffice. FIG. 9 illustrates an exemplary case of providing five holes, as the opening 150, which originate from the extension part 212 and go through upward. The opening 150 may alternatively be a hole which originates from the extension part 212 and goes through downward, a hole which originates from the intersection part 211 and goes through upward or downward, or combinations of them.

Also in the insulating resin layer 160a, portions of intersection between the void 140a and the signal line 20 are provided, and the uninterrupted insulating resin part 145a is provided in the direction of extension of the printed circuit board 200a.

Third Embodiment

Figure 10:
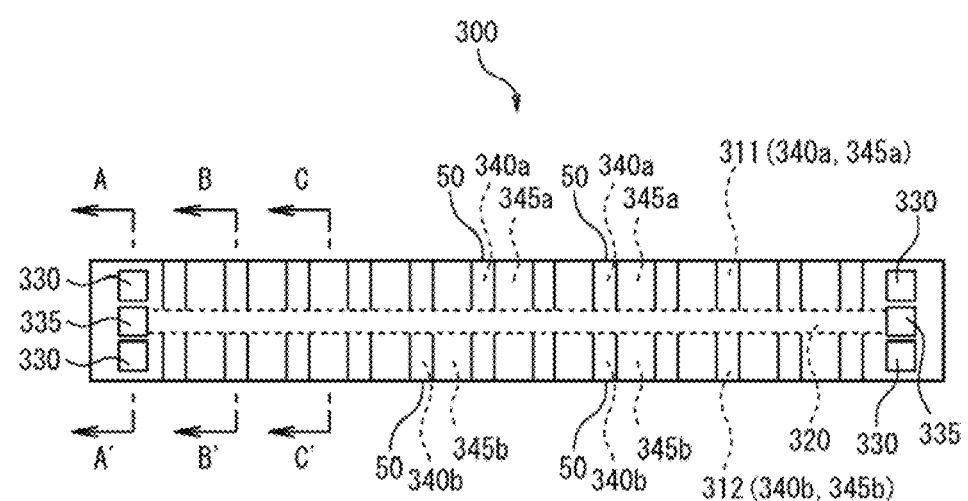
FIG. 10 A plan view illustrating a printed circuit board according to a third embodiment of the present invention.
Figure 11:
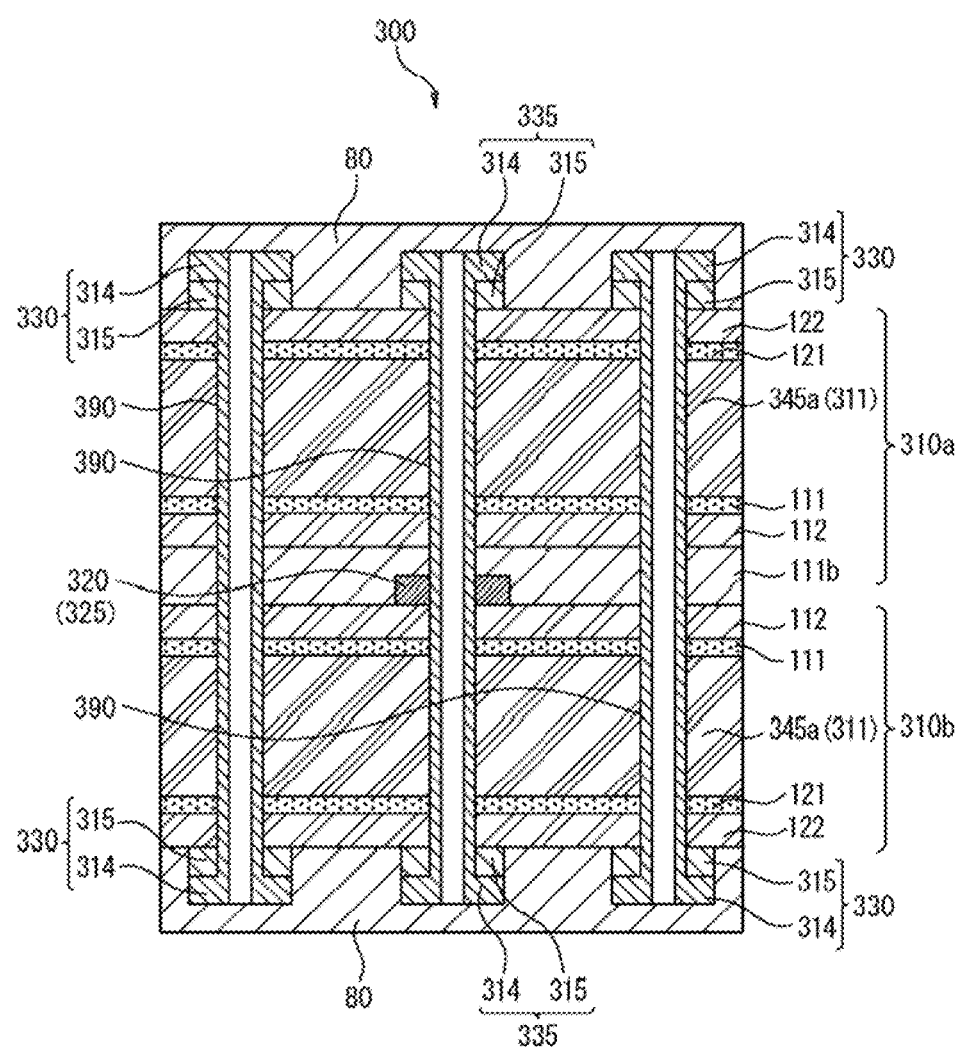
FIG. 11 An A-A' cross-sectional view of the printed circuit board illustrated in FIG. 10.
Figure 12:
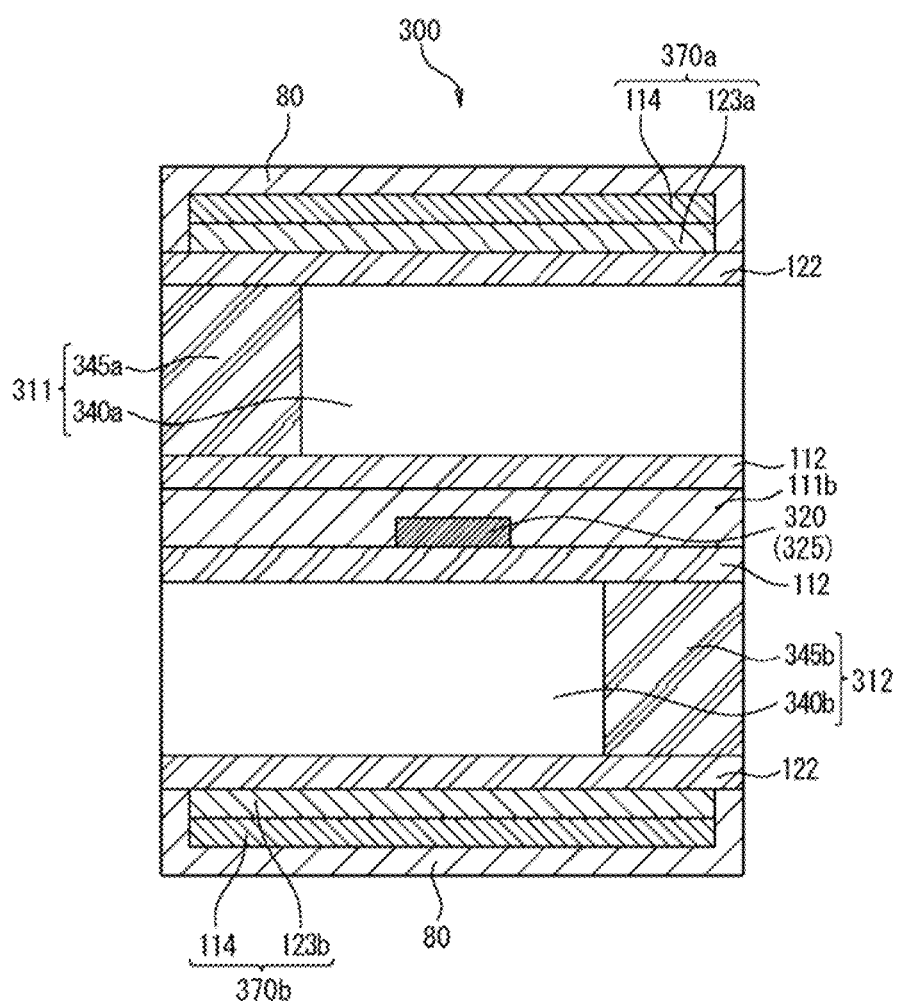
FIG. 12 A B-B' cross-sectional view of the printed circuit board illustrated in FIG. 10.
Figure 13:
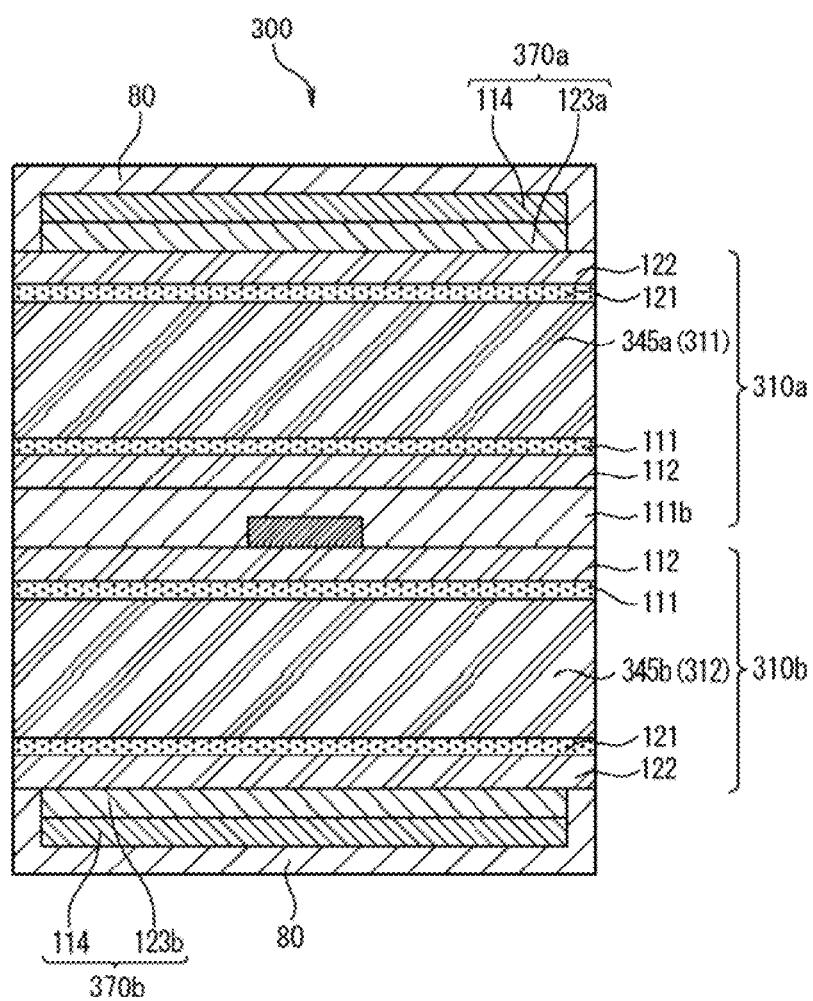
FIG. 13 A C-C' cross-sectional view of the printed circuit board illustrated in FIG. 10.
Figure 14A:
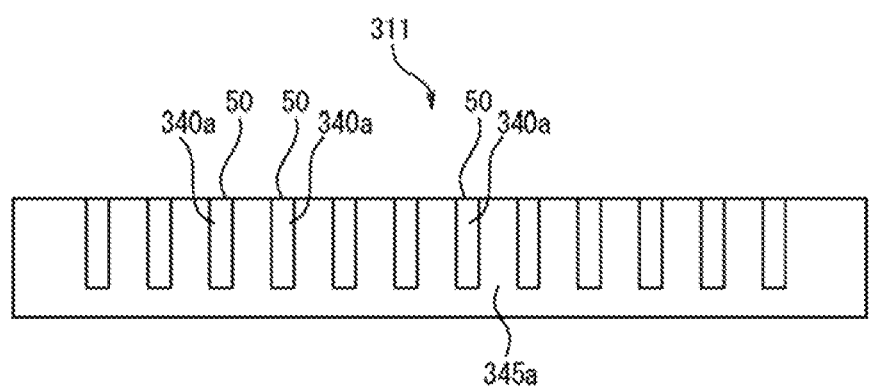
FIG. 14A and FIG. 14B FIG. 14A is a plan view illustrating a first insulating layer in the third embodiment of the present invention.

Next, a printed circuit board 300 according a third embodiment of the present invention will be explained, referring to FIG. 10 to FIG. 13, FIG. 14A and FIG. 14B. FIG. 10 is a plan view illustrating the printed circuit board 300 of the third embodiment. FIG. 10 is a plan view illustrating the printed circuit board 300 of the third embodiment of the present invention. FIG. 11 is an A-A' cross sectional view of the printed circuit board 300 illustrated in FIG. 10. FIG. 12 is a B-B' cross sectional view of the printed circuit board 300 illustrated in FIG. 10. FIG. 13 is a C-C' cross sectional view of the printed circuit board 300 illustrated in FIG. 10. FIG. 14A is a plan view of a first insulating resin layer 311 in the third embodiment of the present invention, and FIG. 14B is a plan view of a second insulating resin layer 312 in the third embodiment of the present invention.

As illustrated in FIG. 12 and FIG. 13, the printed circuit board 300 has a ground layer 370a which is a first conductor layer opposed to one face of a signal line 320, and a ground layer 370b which is a second conductor layer opposed to the other surface of the signal line 320. The printed circuit board 300 also has a first insulating resin layer 311 provided between the signal line 320 and the ground layer 370a which is the first conductor layer, and a second insulating resin layer 312 provided between the signal line 320 and the ground layer 370b which is the second conductor layer.

Figure 14B:
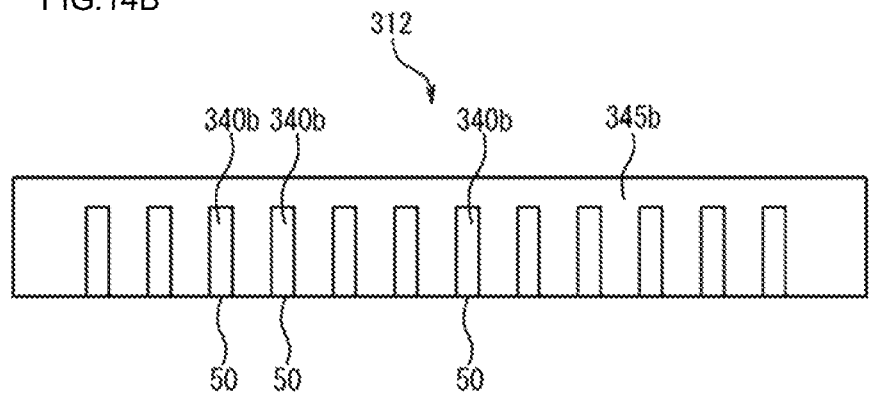

As illustrated in FIG. 14A and FIG. 14B, in a plan view, the first void 340a provided in the first insulating resin layer 311 and the second void 340b provided in the second insulating resin layer 312 are arranged so as to cross the signal line 320, and are symmetrical about the signal line 320 at the center.

This embodiment represents one example in which the present invention is embodied in a printed circuit board with the strip line structure.

When the present invention is embodied in the printed circuit board with the strip line structure, the above-described first embodiment or the second embodiment may be embodied only on one face side of the interposed signal line. Alternatively, the present invention encompasses a case where the first embodiment or the second embodiment is embodied on both surface sides of the signal line, and a mode where the first embodiment and the second embodiment are respectively embodied on both surface sides of the signal line.

Among others, this embodiment is characterized in that, in the printed circuit board 300 with the strip line structure, the voids provided in the two interposed insulating resin layers cross the signal line 320 in a plan view, and are patterned symmetrically about the signal line 320 at the center.

A configuration of the printed circuit board 300 will be explained below.

As illustrated in FIG. 10, the printed circuit board 300 includes a signal layer 325 having one signal line 320. The signal layer 325 is interposed in the printed circuit board 300 (FIG. 11). On one side of the signal layer 325, provided is a ground layer 370a as a conductor layer while placing the first insulating resin layer 311 in between, and on the other side, provided is a ground layer 370b while placing a second insulating resin layer 312 in between (FIG. 12, FIG. 13).

The protective layers 80 are provided on both faces of the printed circuit board 300, and ground pads 330 and signal pads 335 are provided under the protective layers 80. The ground pads 330 are provided, in a plan view, in the same location as the ground pads 30 in the first embodiment. The ground pads 330 provided on both faces of the printed circuit board 300 are electrically connected with each other by plated layers 314 which are laid uninterruptedly through through-holes 390.

The ground pads 335 are provided in the same plane with the ground pads 330 and in locations of overlapping, in a plan view, with both end portions of the signal line 320. The signal pads 335 provided on both faces of the printed circuit board 300 are, in the same way as the ground pads 330, electrically connected with each other by the plated layers 314 which is laid uninterruptedly through the through-hole 390. In addition, the signal pads 335 are also electrically connected to the signal line 320, in the location where they extend through the signal layer 325.

The layer structure of the printed circuit board 300 may be understood referring to the cross sectional views in FIG. 11 to FIG. 13. More specifically, in the printed circuit board 300, an adhesion layer 111b is provided so as to oppose one face side of the signal line 320 (so as to oppose the top face of the signal line 320 in FIG. 10), and further thereon, the insulating base 112 and the adhesion layer 111 are provided. For the adhesion layer 111b, a low flow bonding sheet of typically 25 μm thick or around may be used. For the insulating base 112, a liquid crystal polymer film of typically 25 μm thick or around may be used. For the adhesion layer 111, a low flow bonding sheet of typically 15 μm thick or around may be used. Further on the top face thereof, there is provided a first insulating resin layer 311 of typically 100 μm thick or around, which is configured by the first voids 340a and first insulating resin parts 345a. Over the top face of the first insulating resin layer 311, there are provided the adhesion layer 121 and the insulating base 122, and further thereon formed are the signal pad 335 and the ground pads 330. For the adhesion layer 121, a low flow bonding sheet of typically 15 μm thick or around may be used. For the insulating base 122, a liquid crystal polymer film of typically 25 μm thick or around may be used. An insulating layer 310a is configured by the adhesion layer 111b, the insulating base 112, the adhesion layer 111, the first insulating resin layer 311, the adhesion layer 121 and the insulating base 122. The printed circuit board 300 is provided with the protective layers 80 as the outermost layers.

On the other hand, the insulating layer 310b opposed to the other face side of the signal line 320 (opposed to the bottom surface of the signal line 320 in FIG. 10) is configured in the same way as described above except that the adhesion layer 111b is not provided, thereby forming a layer structure nearly symmetrical about the signal layer 325 at the center in the thickness direction. The adhesion layer 111b is a layer for leveling the irregularity in height over the signal layer 325 which covers the signal line 320 so as to planarize the base, and has a thickness larger than the height of the signal line 320.

Next, the first insulating resin layer 311 and the second insulating resin layer 312 will be explained.

The first insulating resin layer 311 has, as illustrated in FIG. 14A, a plurality of first voids 340a which extend in the width direction of the printed circuit board 300. The first voids 340a have one end portions thereof which reach the outer rim of the long side of 300 to form the openings 50 there, through which communication with the outside is established. The other end portions of the first voids 340a do not reach the outer rim of the long side, and are therefore closed. The length of extension of the first voids 340a is arbitrary so long as they can cross the signal line 320 over the entire width thereof.

Around the first voids 340a, the first insulating resin part 345a resides. Since the other end portions of the first voids 340a do not reach the outer rim of the long side, there is a region of the first insulating resin part 345a which extends in an uninterrupted manner along the long side of the printed circuit board 300.

The second insulating resin layer 312 has, as illustrated in FIG. 14B, a plurality of second voids 340b which extend in the width direction of the printed circuit board 300, and a second insulating resin part 345b disposed therearound. The second voids 340b and the second insulating resin part 345b are configured so as to be symmetrical to the first voids 340a, in a plan view, about the signal line 320 at the center.

The printed circuit board 300 has the first insulating resin layer 311 and the second insulating resin layer 312. Accordingly, in a plan view of the printed circuit board 300, as illustrated in FIG. 10, there are observed the voids which cross the signal line 320, extend in the width direction of the printed circuit board 300, and have the openings 50 at both ends. The voids are, however, configured by stacking the first insulating resin layer 311 and the second insulating resin layer 312, while placing the signal layer 325 in between. In reality, as illustrated in FIG. 12, the first voids 340a and the second voids 340b have portions which vertically overlap in the thickness direction. The first voids 340a and the second voids 340b are closed at the end sides opposite to the sides having the openings 50. Accordingly, in the width direction of the printed circuit board 300, the first insulating resin layer 311 includes regions where the first voids 340a and the first insulating resin part 345a are provided (FIG. 14A). Similarly, the second insulating resin layer 312 includes regions where the second voids 340b and the second insulating resin part 345b are provided (FIG. 14B). With this configuration, it is now possible to arrange the voids both on the upper side and the lower side of the signal line 320, and to provide the insulating resin parts which are laid uninterruptedly along both long sides of the printed circuit board 300. In this way, the transmission loss is sufficiently reduced, and a good level of rigidity is secured for the printed circuit board.

Ratio of area of the first voids 340a and the first insulating resin part 345a of the first insulating resin layer 311, as seen in the cross section in FIG. 12, may be designed arbitrarily taking a balance between required transmission characteristics and strength of the printed circuit board 300 into consideration. The ratio of area of the second voids 340b and the second insulating resin part 345b of the second insulating resin layer 312 may follow that of the first insulating resin layer 311.

Note that the present invention, when embodied in the microstrip line structure, by no means excludes an asymmetrical arrangement of the first insulating resin layer 311 and the second insulating resin layer 312 while placing the signal line 320 in between. In this case, the ratio of area of the first void 340a and the first insulating resin part 345a of the first insulating resin layer 311, and the ratio of are of the second void 340b and the second insulating resin part 345b may be different.

Although not illustrated, in the printed circuit board 300 of this embodiment, it is alternatively possible to use the insulating resin layer 60 having therein the voids 40 and the insulating resin parts 45 illustrated in FIG. 1, respectively for the first insulating resin layer 311 and for the second insulating resin layer 312. In other words, in a plan view, the first voids 340a provided to the first insulating resin layer 311 and the second voids 340b provided to the second insulating resin layer 312 may cross the signal line 320 and are symmetrical to each other about the signal line 320 at the center, and in particular, both may be same.

Fourth Embodiment

Next, a method of manufacturing a printed circuit board according to a fourth embodiment of the present invention (also referred to as "this manufacturing method") will be explained referring to FIG. 15A, FIG. 15B, FIG. 15C, FIG. 16A, FIG. 16B, FIG. 16C, FIG. 17A, FIG. 17B, FIG. 17C, and FIG. 18. This embodiment relates to an exemplary case where the printed circuit board 100 of the first embodiment is manufactured by this manufacturing method.

Figure 15A:
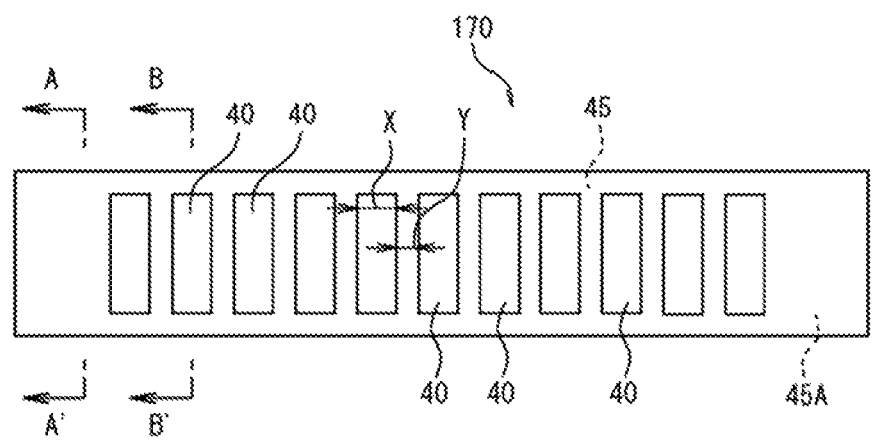
Figure 15B:
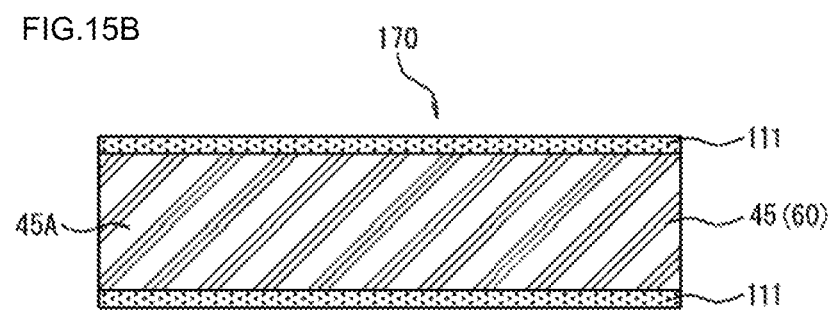
Figure 15C:
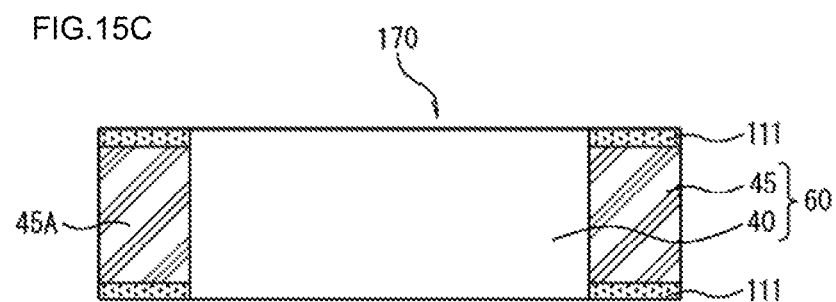
Figure 16A:
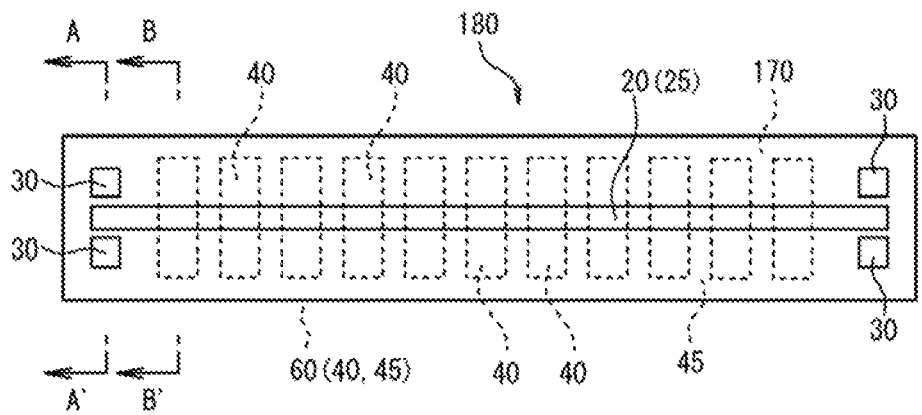
Figure 16B:
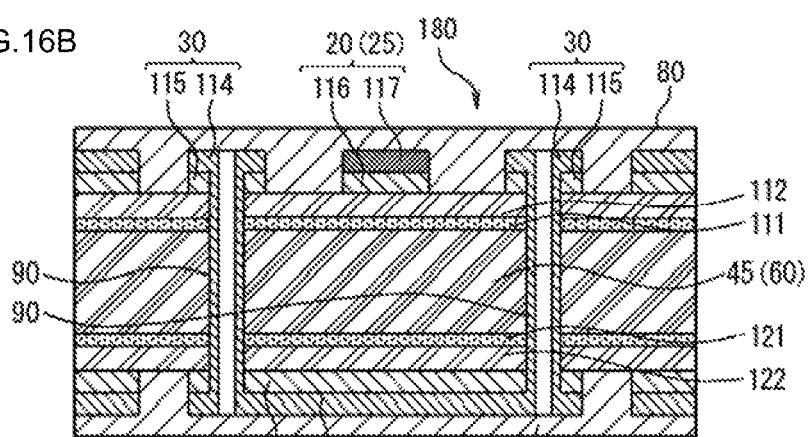
Figure 16C:
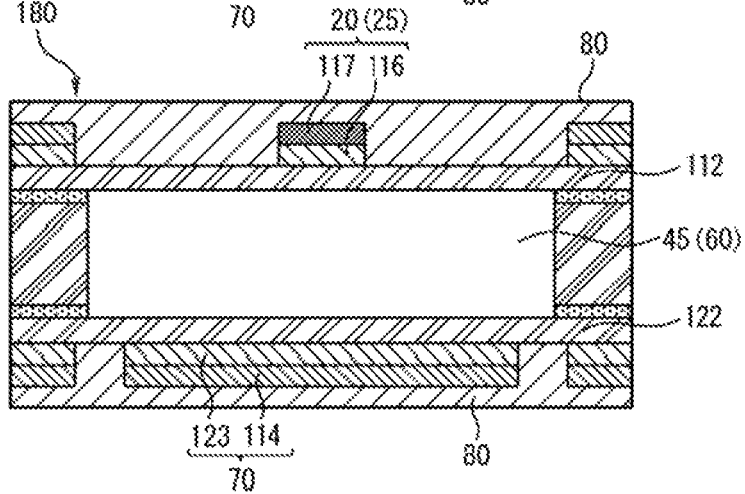
Figure 17A:
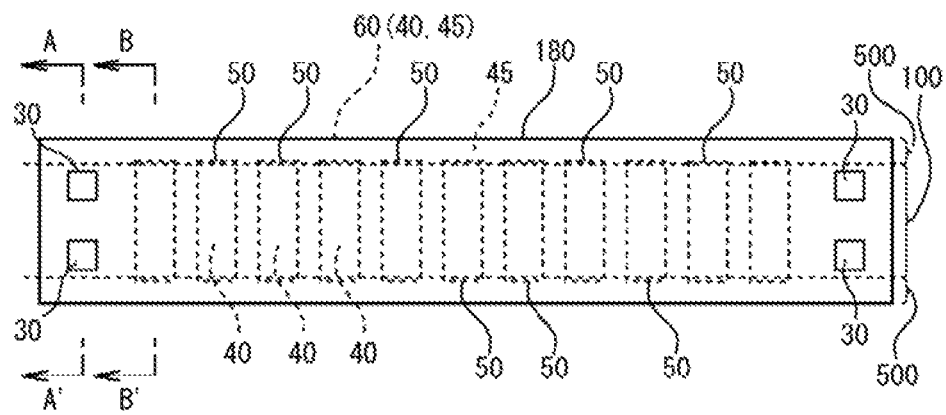
Figure 17B:
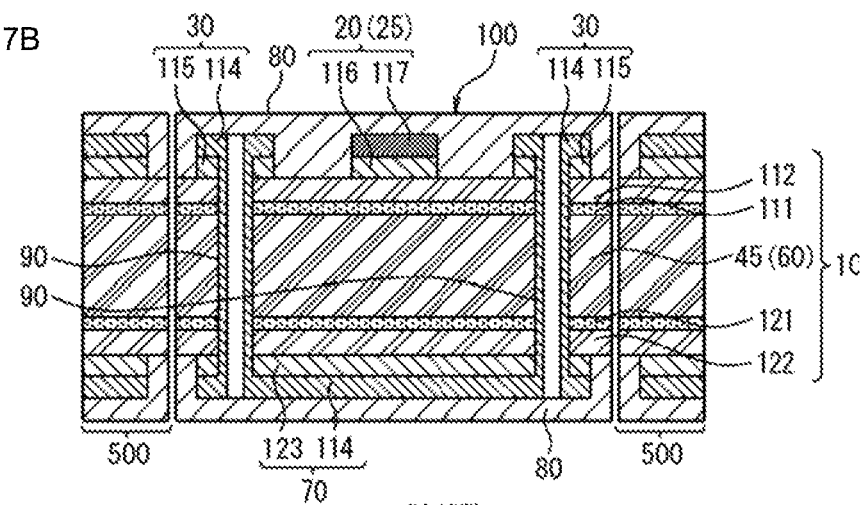
Figure 17C:
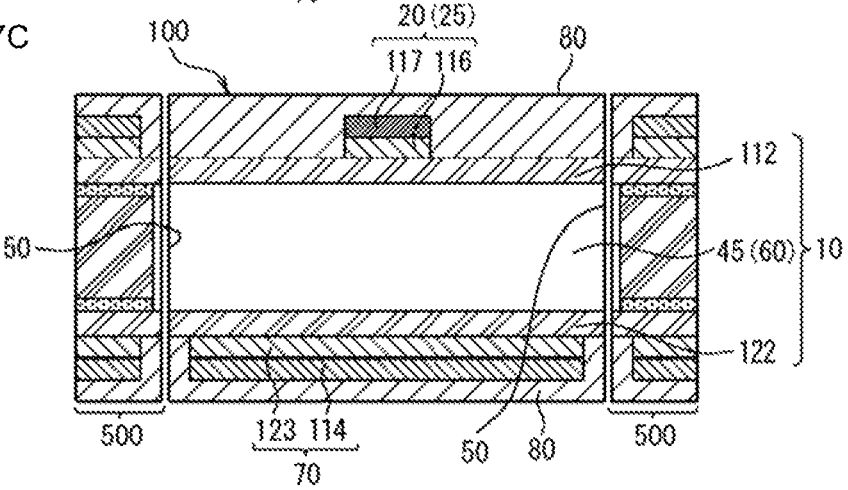
Figure 18:
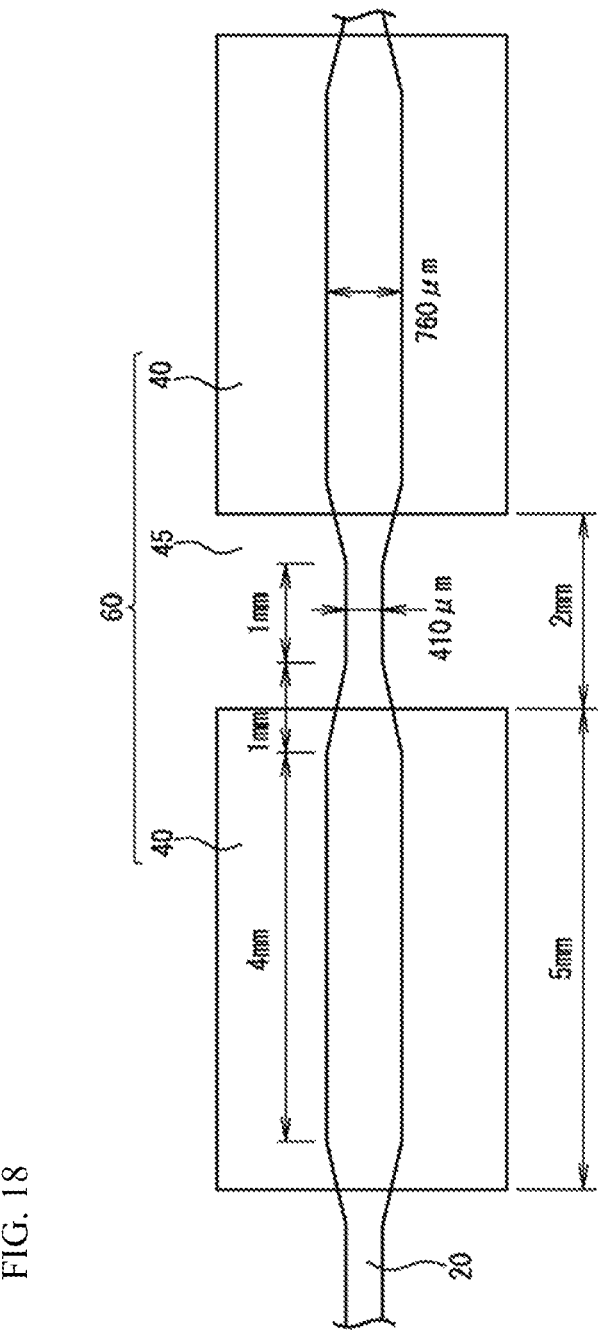
FIG. 18 An explanatory drawing illustrating one embodiment of a signal line in the present invention.

FIG. 15A to FIG. 15C are drawings explaining a void forming step in the method of manufacturing a printed circuit board according to the fourth embodiment of the present invention. FIG. 15A is a plan view illustrating the insulating resin layer 60 formed in the void forming step, FIG. 15B is an A-A' cross sectional view of FIG. 15A, and FIG. 15C is a B-B' cross sectional view of FIG. 15A. FIG. 16A to FIG. 16C are drawings explaining a substrate forming step in the method of manufacturing a printed circuit board according to the fourth embodiment of the present invention. FIG. 16A is a plan view illustrating a substrate 180 formed in the substrate forming step, FIG. 16B is an A-A' cross sectional view of FIG. 16A, and FIG. 16C is a B-B' cross sectional view of FIG. 16A. FIG. 17A to FIG. 17C are drawings explaining an opening forming step in the method of manufacturing a printed circuit board according to the fourth embodiment of the present invention. FIG. 17A is a plan view illustrating the printed circuit board 100 and fragments 500 cut off from the edge portions. FIG. 17B is an A-A' cross sectional view of FIG. 17A. FIG. 17C is a B-B' cross sectional view of FIG. 17A. FIG. 18 is a drawing explaining an embodiment of the signal line 20 in the present invention.

The method of manufacturing a printed circuit board according to this embodiment is a method of manufacturing the printed circuit board 100 which includes the ground layer 70 as the conductor layer, the signal line 20 provided to oppose the ground layer 70 as the conductor layer, and the insulating resin layer 60 disposed between the ground layer 70 as the conductor layer and the signal line 20.

This manufacturing method has the void forming step, the substrate forming step, and the opening forming step.

The void forming step is a step of providing the voids 40 in the plane of the insulating resin film 170 (FIG. 15A to FIG. 15C).

The substrate forming step is a step of providing the signal line 20 on one face side of the insulating resin film 170 obtained in the void forming step, in overlapping locations in a plan view with the voids 40, and of providing the ground layer 70 as the conductor layer on the opposite surface side, to thereby form the substrate 180 which is configured by the insulating resin layer 60 having the insulating resin film 170 with the voids 40, and the signal line 20 and the ground layer 70 as the conductor layer opposed with each other while placing the insulating resin layer 60 in between (FIG. 16A to FIG. 16C, and FIG. 17A to FIG. 17C).

The opening forming step is a step of forming the openings 50 through which the voids 40, provided inside the substrate 180 obtained in the substrate forming step, are allowed to communicate with a gas phase outside the substrate 180.

In this manufacturing method, the voids 40 are formed prior to formation by stacking of the major constituent layers such as the signal layer 25 and the ground layer 70. According to this manufacturing method, the voids 40 are formed easily without a risk of damaging the other layers. In this manufacturing method, the voids 40 are formed. Alternatively, in this manufacturing method, the signal line 20 and the ground layer 70 are laminated, prior to formation of the openings through which communication between the voids 40 and the outside is established.

According to this manufacturing method, it is now possible to prevent any chemical liquid used in the processes of stacking the signal line 20 and the ground layer 70, and dusts possibly produced in the processes, from entering the voids 40. In particular, even if the substrate forming step includes a process of electroless plating or formation of photosolder resist, the voids 40 still remain unopened, and are therefore prevented from being polluted due to any possible residence of plating liquid and residue thereof, or chemical liquid used for forming the photosolder resist.

According to this manufacturing method, it is now possible to stably manufacturing the printed circuit board 100 which has the voids 40 in the insulating resin layer 60, and the openings provided to the voids 40. According to this manufacturing method, it is now possible to stably manufacturing the printed circuit board 100 which can reduce the transmission loss without thickening the substrate, without needing any special process.

The individual steps of this manufacturing method will be detailed below.

First, the void forming step will be explained.

As illustrated in FIG. 15A, FIG. 15B and FIG. 15C, the void forming step begins with lamination of the adhesion layers 111 on both faces of an insulating resin film 45A (for example, a liquid crystal polymer film of approximately 100 μm thick) to thereby form the insulating resin film 170. A method of forming the adhesion layers 111 is selectable, for example, from coating techniques such as die coating, and lamination of separately available adhesive sheets (low flow bonding sheet of approximately 15 μm thick).

The insulating resin film 170 is then, for example, punched using dies, in predetermine size and locations, to form the voids 40.

For example, the void forming step may include a step of forming the voids 40 in the plane of the insulating resin film 170 and in a predetermined location other than in the outer rim, so as to extend through the film in the thickness direction. In this way, the voids 40 with a desired size may be formed easily in desired locations in the insulating resin film 170. The method of forming the voids 40 in the insulating resin film 170 is not limited to punching using dies, and may be embodied by any one of, or combination of laser or plasma cutting, drilling, wet etching of resin and so forth.

This embodiment will further be explained referring to a case of forming the voids 40 which extend through the insulating resin film 170 in the thickness direction as described above.

The later-described opening forming step will explain mainly a case of forming the openings 50 in the outer rim of the substrate.

The insulating resin film 45A which remains around the voids 40, formed by punching, serves as the insulating resin parts 45. The voids 40 and the insulating resin parts 45 configure the insulating resin layer 60. In the insulating resin film 45A, ratio of the voids 40 formed by punching, and portions remained as the insulating resin parts 45 may be set arbitrarily, taking a balance between transmission characteristics required for the printed circuit board 100 to be manufactured, and the rigidity of the printed circuit board 100 into consideration. For example, width X of the voids 40 which extend in the plane of insulating resin film 170 in the thickness direction, indicated in FIG. 15A, preferably falls in the range from 0.1 mm or larger and 10 mm or smaller. Similarly, distance Y between the adjacent voids 40 (in other words, portions remained as the insulating resin parts 45 between the voids 40) is preferably 1 mm or larger and 100 mm or smaller.

As a result of carrying out the void forming step described above, in a width-wise (A-A') cross section taken at a location where the insulating resin film 170 has no void 40 formed therein, the insulating resin part 45 is observed over the entire area of the insulating resin layer 60 (FIG. 15B). In a width-wise (B-B') cross section taken at a location where the insulating resin film 170 has the void 40 formed therein, there are observed the void 40 at the center of the insulating resin layer 60, and the insulating resin part 45 on both sides thereof (FIG. 15C).

Next, the substrate forming step will be explained.

The substrate forming step is a step of forming major constituent layers of the printed circuit board 100. More specifically, assuming the insulating resin film 170 having the voids 40 formed therein, which was obtained in the void forming step, at the center, the signal layer 25 is formed on one side, and the ground layer 70 is formed on the other side. In this process, an arbitrary insulating layer may be interposed additionally between the insulating resin film 170 and the signal layer 25, and between the insulating resin film 170 and the ground layer 70. In addition, also a step of providing the ground pads 30 on the signal layer side, and connecting them through the through-holes 90 to the ground layer 70 may be implemented in the substrate forming step.

FIG. 16A to FIG. 16C illustrate the substrate 180 provided with the configuration formed in the substrate forming step.

The steps for forming the substrate 180 using the insulating resin film 170 will be explained step by step below.

First, prepared are laminated plates with copper foil on one side, having a copper foil layer 115 (for example, a copper foil of approximately 12 μm thick) laminated on one face of the insulating base 112 (for example, a liquid liquid crystal polymer film of approximately 25 μm thick). On both faces of the insulating resin film 170, two laminated plates with copper foil on one side are aligned so as to direct the insulating bases 112 inward, and are tentatively bonded using the adhesion layers 111 for lamination. In this process of lamination, unnecessary outflow of the adhesive at the adhesion layers 111 is avoidable, by using a flat press machine for lamination, so as to uniformly apply pressure in the thickness direction. Since intrusion of the adhesive into the voids 40 may degrade the transmission characteristics, it is preferable to use a low flow type adhesive for the adhesion layer 111. The copper foil layer 115 on the other surface may also be used as the copper foil layer 123 composing the ground layer 70. In short, all of the copper foil layer 115, the copper foil layer 116, and the copper foil layer 123 illustrated in the drawings may be configured by the same type of copper foil layer. This manufacturing method, however, encompasses a case where any one of, or all of, the copper foil layer 115, the copper foil layer 116, and the copper foil layer 123 are formed using different conductive materials. Any foil, ink or paste, which contain a conductive material other than copper, is usable in place of the copper foil layer.

Next, the through-holes 90 are formed so as to establish interlayer connection between the ground pads 30 and the ground layer 70. The through-holes 90 are provided by forming holes which extend through the laminated structure formed between the ground pads 30 and the copper foil layer 123 composing the ground layer 70. The holes which extend through the laminated structure may be formed, for example, by using a drill for lathing. The through-holes 90 in this manufacturing method are, however, not limited thereto, and encompass a mode where the interlayer connection is established through bottomed via holes formed by laser machining or the like. By conductivity-imparting treatment or electrolytic copper plating of the through-holes 90, the plated layer 114 is formed over the surface of the ground pads 30, the inner surfaces of the through-holes 90, and over the surface of the copper foil layer 123. In this way, the interlayer conduction is established between the ground pads 30 and the ground layer 70. The ground layer 70 is configured by the copper foil layer 123 and the plated layer 114.

The laminated layer composed of the copper foil layer 115 and the plated layer 114 is patterned according to a desired pattern to form the signal line 20 and the ground pads 30. In this embodiment, the copper foil layer 115 is also used as the copper foil layer 116 composing the signal line 20. The patterning may be implemented, for example, by a photolithographic technique.

On the surface opposite to the surface having the signal line 20 provided thereon, the ground layer 70 is patterned so as to determine the boundary of the ground layer 70 within the outer rim of the substrate surface. Lastly, the protective layers 80 are formed over both faces of the substrate, to thereby obtain the substrate 180.

For the case where techniques of electroless plating, photosolder resist forming and so forth are applied to obtain the printed circuit board 100, such techniques are preferably implemented in the substrate forming step. In other words, by implementing these processes prior to the opening forming step described later, the voids 40 are successfully prevented from being polluted by residence of the plating liquid or residue thereof, or chemical liquid used for forming the photosolder resist.

Although not illustrated, as a modified example of this embodiment, a metal film may be used in place of the copper foil layer 115 in the substrate forming step, and a plating resist generally used for the semi-additive process may be formed before the electrolytic copper plating. It is also possible to apply, after the electrolytic copper plating, the semi-additive process by which the metal film is removed by flash etching. According to this mode, variation in width of the signal line may be reduced, and thereby the characteristic impedance may be stabilized.

Next, the opening forming step will be explained.

The opening forming step is a step of forming the openings 50 through which communication is established between the voids 40, which are provided inside the substrate 180 obtained in the substrate forming step, and a gas phase outside the substrate 180.

In this embodiment, explanation will be made mainly on a mode where the openings 50 are formed by trimming off the outer rim of the substrate together with the end portions of the voids 40. More specifically, as illustrated in FIG. 17A, substrate 180 is trimmed at positions which lie in the outer rims along the long sides, and include the end portions of the voids 40. Trimming lines are specifically indicated by two broken lines which laterally extend in FIG. 17 (17A).

By trimming the outer rims, two fragments 500 and the printed circuit board 100 are obtained. An A-A' cross section of the substrate 180 is shown in FIG. 17B, and a B-B' cross section is shown in FIG. 17B.

As seen in FIG. 17B, in the cross section taken at a position without the void 40, the entire portion of the insulating resin layer 60 is configured by the insulating resin part 45. On the other hand, as seen in FIG. 17C, in the cross section taken at a position where the void 40 is provided, the insulating resin layer 60 is configured by the void 40 having the openings 50 on both ends thereof.

In the opening forming step described above, the openings 50 are preferably formed at positions, in a plan view, different from positions where the signal line 20 is formed.

This successfully avoids that the cross sectional area of the signal line 20 locally varies.

By the way, it has been known that, in the process of formation of the printed circuit board, formation of the laminated structure is generally followed by trimming of the substrate.

Also this manufacturing method may further include a trimming step in which the substrate 180 is trimmed at arbitrary positions on the outer rim, in order to shape the appearance of the substrate 180. In the trimming step, the opening forming step may be carried out concurrently, by trimming off the end portions of the voids 40 formed in the void forming step together.

In this manufacturing method, by concurrently carrying out the trimming step and the opening forming step, it is now possible to provide the voids 40, through which communication with the outside is established, without needing additional step of forming the openings 50.

Alternatively, the opening forming step may include, as a different means for forming the openings, a step of forming the openings by irradiating the voids 40 with laser light from the outside of the substrate 180.

The opening forming step may be carried out by routing instead of laser irradiation.

In particular, for the case where the openings 50 need a long length of the constituent holes, it is effective to form the openings 50 by laser irradiation or routing. Thus the openings 50 are successfully provided in desired locations, without damaging the other layers. For example, the openings 150 which are provided, in the top face or the back face of the printed circuit board 200, to establish therethrough communication of voids 140 with the outside as previously described in the second embodiment, are preferably formed by carrying the opening forming step using laser irradiation or a router.

Now, when the signal line 20 is patterned in the substrate forming step described above, a special attention may be paid on a relation between the width of the signal line 20 and the voids 40. More specifically, in a plan view, the signal line 20 may be formed so as to have a larger width in the region overlapped with the voids 40, than in other region different from that region.

In other words, the printed circuit board 100 may be configured so that the signal line 20 has a larger width in the region overlapped with the voids 40, than in the region other than the above-described region.

The regions in which the voids 40 lie right under the signal line 20 in a plan view (that is, the regions overlapped with the voids 40) tend to have an effective dielectric constant between the signal line 20 and the ground layer 70, smaller than that in the region in which no void 40 lie right under the signal line 20 (that is, regions other than the above-described region). Accordingly, by properly tuning the width in relation to the voids 40 as described above, the effective dielectric constant along a single signal line 20 may be tuned, and thereby a highly precise impedance matching becomes available.

An exemplary case where the width of the signal line 20 is tuned in relation to the voids 40 is illustrated in FIG. 18. FIG. 18 is a partially enlarged view of the signal line 20, and the voids 40 which lie across the signal line 20, on the printed circuit board 100 in a plan view.

As seen in FIG. 18, on the printed circuit board 100, there are provided two adjacent voids 40, and the insulating resin part 45 which resides in between, and the signal line 20 lies across them in a plan view. For an exemplary case where the characteristic impedance is tuned to 50Ω, the signal line 20 may be designed to have the width as illustrated in FIG. 18. That is, as illustrated in FIG. 18, the signal line 20 may be designed to have a width of 760 μm in the region overlapped with the voids 40, and to have a width of 410 μm in the other region (region overlapped with the insulating resin part 45). Note, however, that the widths shown in FIG. 18 are merely illustrative ones, so that specific widths of the signal line 20 may properly be determined. From the viewpoint of smoothening the transmission, in the width transition regions of the signal line 20 (that is, boundaries between the voids 40 and the insulating resin part 45), the width is preferably varied in a gradient manner, rather than in a stepwise manner. In FIG. 18, the width transition regions of 1 mm long are provided between maximum width regions of 760 μm wide and minimum width regions of 410 μm wide.

Note, however, that the tuning of the width of the signal line 20 illustrated in in FIG. 18 is merely one example of this manufacturing method and the printed circuit board of the present invention, and by no means excludes the case where the signal line 20 is designed to have a constant width in an arbitrary portion or over the entire portion. For example, even if the signal line 20 illustrated in FIG. 18 is modified to have a constant width of 585 μm, transmission characteristics equivalent to those of the signal line 20 illustrated in FIG. 18 may be given in a frequency band up to 5 GHz or around. The width of 585 μm is now given as the average of the maximum width of 760 μm and the minimum width of 410 μm of the signal line illustrated in FIG. 18.

EXAMPLE

Example 1

The printed circuit board 100 was manufactured as described below, which was denoted as Example 1.

First, as a film for composing the insulating resin layer 60, used here was a liquid crystal polymer film of 100 μm thick. Low flow bonding sheets of 15 μm thick (corresponded to the adhesion layer 111 and the adhesion layer 121) were laminated as the adhesive sheets on both faces of the liquid crystal polymer film, to obtain a laminated sheet. The laminated sheet was then punched at predetermined positions according to the pattern illustrated in FIG. 1, so that the voids 40 and the insulating resin parts 45 are arranged in the direction of extension of the printed circuit board 100. Each void 40 was made with a width of 5 mm in the direction of extension of the film, and the insulating resin part 45 was made with a width of 2 mm in the same direction. In this way, the insulating resin layer 60 having, respectively on both faces thereof, the adhesion layer 111 and the adhesion layer 121 was obtained.

Next, as the insulating base 112 and the insulating base 122, prepared were two laminated plates with copper foil on one side, each configured by a liquid crystal polymer film of 100 μm thick, and having on one face thereof a copper foil of 12 μm thick. The laminated plates with copper foil on one side were laminated with the insulating resin layer 60 obtained above, while directing the insulating base 112 and the insulating base 122 inward, and were tentatively bonded by flat pressing, to thereby obtain a laminate.

The laminate was then drilled using an NC drill, so as to form through-holes 90 at predetermined positions. The plated layers 114 were then formed over the thus formed through-holes 90 by conductive treatment and electrolytic copper plating, to thereby establish interlayer conduction between both faces of the substrate. On the laminate having the through-holes 90 and the layers 114 formed therein, the signal line 20, the ground pads 30 and so forth were formed according to a predetermined pattern by a photolithographic technique. The signal line 20 was patterned to have the thickness values indicated in FIG. 18. Next, on both faces, formed as the protective layers 80 were so-called cover lays, each composed of a polyimide film of 12.5 μm thick and an adhesive layer of 30 μm thick.

Lastly, the trimming step and the opening forming step are carried out concurrently, by trimming the substrate 180 along the broken lines indicated in FIG. 17A, FIG. 17B and FIG. 17C, to thereby appropriately shape the appearance of the substrate, and to form the openings 50 at both ends of the voids 40. The printed circuit board 100 with the microstrip line structure was manufactured as described above, which was denoted as Example 1.

Comparative Example 1

A printed circuit board was manufactured in the same way as in Example 1, except that a polyimide film of 50 μm thick was used as the insulating resin layer 60 provided with no void 40, and that the signal line of 100 μm wide was used, which was denoted as Comparative Example 1.

Comparative Example 2

A printed circuit board was manufactured in the same way as in Example 1, except that a liquid crystal polymer film of 50 μm thick was used as the insulating resin layer 60 provided with no void 40, and that the signal line of 110 μm wide was used, which was denoted as Comparative Example 2.

Comparative Example 3

A printed circuit board was manufactured in the same way as in Example 1, except that the void 40 was not provided, and that the signal line of 410 μm wide was used, which was denoted as Comparative Example 3.

(Evaluation of Transmission Loss)

Transmission loss (S21) of Example 1 and Comparative Example 1 to Comparative Example 3 were measured using a vector network analyzer over the range from 10 MHz to 10 GHz, and evaluated in frequency bands of 5 GHz and 10 GHz. Results of evaluation are shown in Table 1.

All of Example 1, and Comparative Example 1 to Comparative Example 3 were designed to have the characteristic impedance tuned to 50Ω, by controlling the width of the signal line.

As shown in Table 1, in the same frequency band, Example 1 was confirmed to show a transmission loss smaller than any of those of Comparative Examples.

In particular, from comparison between the transmission loss of Example 1 and the transmission loss of Comparative Example 1 having the same thickness of insulating resin layer 60, Example 1 was found to show an approximately 30% reduction in the transmission loss. The effect of reducing the transmission loss by provision of the void 40 was thus confirmed. It is therefore understood that the printed circuit board of the present invention can afford transmission over longer distance than the conventional printed circuit boards having no voids. In addition, it was suggested that the printed circuit board of the present invention can afford transmission up to higher frequency band, when compared at the same transmission distance. Accordingly, electronic instruments mounted with the printed circuit board of the present invention can improve the degree of freedom in design as compared with the conventional ones, or enable high-speed transmission without affecting design of instruments.

From the viewpoint of reduction in transmission loss, comparison between Comparative Example 1 and Comparative Example 2 revealed an advantage of liquid crystal polymer over polyimide, as the resin composing the insulating layer.

TABLE 1

| | | Example 1 | Comparative Example 1 | Comparative Example 2 | Comparative Example 3 |
|---|---|---|---|---|---|
| Width of signal line (μm) (*1) | | 410/760 (*2) | 100 | 110 | 410 |
| Transmission loss | 5 GHz | −0.08 | −0.36 | −0.22 | −0.11 |
| | 10 GHz | −0.14 | −0.66 | −0.38 | −0.22 |

(*1) The width of signal line in Example 1 and Comparative Examples 1 to 3 was determined so as to tune the characteristic impedance to 50 Ω.
(*2) Signal line 20 in Example 1 was patterned according to the pattern with given values of width indicated in FIG. 18.

Comparative Example 4

A printed circuit board was manufactured in the same way as in Example 1, except that the width is widened by 5 mm per each side, and voids 40 are remained unopened, which was denoted as Comparative Example 4.

More specifically, in Comparative Example 4, the trimming step after the protective layers 80 were formed was carried out without being accompanied by the opening forming step, by shifting the two trimming lines indicated by the broken lines in FIG. 17A, FIG. 17B and FIG. 17C outwardly by 5 mm per each side. The voids 40 in Comparative Example 4, remained untrimmed at the end portions, were therefore configured as closed spaces surrounded by the insulating resin parts 45, and by the insulating base 112 and and adhesion layer 121 provided on the top face and back face.

(Temperature Environment Test)

Temperature environment test was carried out as described below, using Example 1 and Comparative Example 4.

Example 1 and Comparative Example 4 under room temperature were allowed to stand under a humid environment at 30° C., 85RH % for 72 hours, and then heated under a reflow condition peaked at 260° C. (over a peak time of approximately 10 seconds). Changes in shape were then observed.

Example 1 showed no observable changes in the appearance. On the other hand, partial blister or deformation was observed on the surface of Comparative Example 4.

It was therefore confirmed from the temperature environment test that there was no problem in changes in the appearance of Example 1. In contrast, Comparative Example 4 showed changes in the appearance of the substrate, due to expansion of air confined in the closed voids 40 under heating.

The embodiments above encompass the technical concepts below.

(1) A printed circuit board comprising a conductor layer, a signal layer having a signal line provided so as to oppose the conductor layer, and an insulating resin layer disposed between the conductor layer and the signal layer, the insulating resin layer having a void in an overlapping location, in a plan view, with the signal line, and the void being communicated with the outside of the printed circuit board.

(2) The printed circuit board according to (1), wherein the void has an opening through which communication with the outside is established, and the opening is provided in a different location from the signal line.

(3) The printed circuit board according to (1) or (2), wherein the void extends through the insulating resin layer in the thickness direction, and the insulating resin layer is zoned into an insulating resin part containing the insulating resin, and the void.

(4) The printed circuit board according to (3) dependent on (2), comprising two or more voids not communicating with each other, and the opening is provided to every void.

(5) The printed circuit board according to any one of (1) to (4), wherein, in a plan view, the void is formed so as to extend in the width direction of the signal line.

(6) The printed circuit board according to (5), wherein the signal layer has a plurality of signal lines arranged in parallel to each other, and, in all of the plurality of signal lines arranged in parallel, the void resides, in a plan view, so as to extend in the width direction.

(7) The printed circuit board according to (5) or (6), the signal line has a larger width in the region overlapped with the void, than in other region different from that region.

(8) The printed circuit board according to any one of (1) to (7), wherein the void has an opening through which communication with the outside is established, and the opening is provided on the outer rim of the printed circuit board.

(9) The printed circuit board according to any one of (1) to (7), wherein the void has an opening through which communication with the outside is established, and the opening is provided on the top face or back face of the printed circuit board.

(10) The printed circuit board according to any one of (3) to (9), further comprising:

a through-hole which extends through the insulating resin layer; and the insulating resin part being provided, in the insulating resin layer, around the through-hole.

(11) The printed circuit board according to any one of (1) to (10), wherein the signal layer has a first signal line and a second signal line which are different in path lengths, the path length of the first signal line being longer than the path length of the second signal line, and the length over which the first signal line crosses the void being longer than the length over which the second signal line crosses the void.

(12) The printed circuit board according to any one of (1) to (11), further comprising:

a first conductor layer opposed to one face of the signal line, and a second conductor layer opposed to the other surface of the signal line, and, a first insulating resin layer provided between the signal line and the first conductor layer, and a second insulating resin layer provided between the signal line and the second conductor layer, and in a plan view, a first void provided in the first insulating resin layer and a the second void provided in the second insulating resin layer cross the signal line, and have a form symmetrical about the signal line.

(13) A method of manufacturing a printed circuit board having a conductor layer, a signal layer having a signal line provided so as to oppose the conductor layer, and an insulating resin layer disposed between the conductor layer and the signal layer, the method comprising:

a void forming step forming a void in the plane of an insulating resin film;

a substrate forming step forming a substrate by providing the signal line on one face of the insulating resin film obtained in the void forming step, in an overlapping location in a plan view with the void, and by providing the conductor layer on the other side, to thereby form a substrate which comprises the insulating resin layer having the insulating resin film provided with the void, and the signal line and the conductor layer which are opposed to each other while placing the insulating resin layer in between; and an opening forming step forming an opening through which communication between the void, provided in the substrate obtained by the substrate forming step, and the gas phase outside the substrate is established.

(14) The method of manufacturing a printed circuit board according to (13), wherein the void forming step further comprises forming the void in the plane of the insulating resin film and in a predetermined location other than in the outer rim, so as to extend through the film in the thickness direction, and, the opening forming step further comprises forming the opening on the outer rim of the substrate.

(15) The method of manufacturing a printed circuit board according to (13), further comprising:

a trimming step cutting an arbitrary portion of the outer rim of the substrate in order to shape the appearance, wherein, in the trimming step, the end portion of the void is cut together to form the opening, that is, to concurrently carry out the opening forming step.

(16) The method of manufacturing a printed circuit board according to (13) or (14), wherein in the opening forming step, the opening is formed in a plan view in a location different from the location where the signal line is formed.

(17) The method of manufacturing a printed circuit board according to (16), wherein the opening forming step comprises a step of forming the opening by irradiating laser light to the void from the outside of the substrate.

This application is based upon and claims the benefit of priority of the prior Japanese Patent Application No. 2013-092022, filed on Apr. 25, 2013, the entire contents of which are incorporated herein by reference.

What is claimed is:

1. A method of manufacturing a flexible printed circuit board having an appearance, the flexible printed circuit board comprising a conductor layer, a protective layer which is formed using an insulating resin, a signal layer having a signal line which is covered with the protective layer and being provided so as to oppose the conductor layer, and an insulating resin layer disposed between the conductor layer and the signal layer, the method comprising:

a void forming step forming a void in the plane of an insulating resin film;

a substrate forming step forming a substrate having an outer rim thereof by providing the signal line on one face of the insulating resin film obtained in the void forming step, in an overlapping location in a plan view with the void, and by providing the conductor layer on the other side, to thereby form the substrate which comprises the insulating resin layer having the insulating resin film provided with the void, and the signal line and the conductor layer which are opposed to each other while placing the insulating resin layer in between; and concurrently performing an opening forming step and a trimming step, wherein the opening forming step forms an opening through which communication between the void, provided in the substrate obtained by the substrate forming step, and the gas phase outside the substrate is established, wherein the trimming step cuts an arbitrary portion of the outer rim of the substrate in a thickness direction of the flexible printed circuit board along a long side in order to shape the appearance, wherein, in the trimming step, the end portion of the void is cut together so as to form the opening, that is, to concurrently carry out the opening forming step.

2. The method of manufacturing a flexible printed circuit board according to claim 1, wherein the void forming step further comprises forming the void in the plane of the insulating resin film and in a predetermined location other than in the outer rim, so as to extend through the film in the thickness direction, and, the opening forming step further comprises forming the opening on the outer rim of the substrate.

3. The method of manufacturing a flexible printed circuit board according to claim 1, wherein in the opening forming step, the opening is formed in a plan view in a location different from the location where the signal line is formed.

4. The method of manufacturing a flexible printed circuit board according to claim 1, wherein in the void forming step the void is formed by punching the insulating resin film in overall thickness of the insulating resin film using dies, and the opening forming step is executed after the void substrate forming step.

* * * * *